(12) United States Patent
Baumberg et al.

(10) Patent No.: US 6,888,994 B2
(45) Date of Patent: May 3, 2005

(54) OPTICAL DEVICE

(75) Inventors: Jeremy J. Baumberg, Winchester (GB); Martin D. B. Charlton, Southampton (GB); Maria C. Netti, Southampton (GB); Gregory J. Parker, Brockenhurst Hants (GB); Majd E. Zoorob, Southampton (GB)

(73) Assignee: BTG International Limited, London (GB)

( * ) Notice: Subject to any disclaimer, the term of this patent is extended or adjusted under 35 U.S.C. 154(b) by 175 days.

(21) Appl. No.: 10/240,928

(22) PCT Filed: Apr. 6, 2001

(86) PCT No.: PCT/GB01/01588
§ 371 (c)(1),
(2), (4) Date: Oct. 31, 2002

(87) PCT Pub. No.: WO01/77726
PCT Pub. Date: Oct. 18, 2001

(65) Prior Publication Data
US 2004/0091224 A1 May 13, 2004

(30) Foreign Application Priority Data
Apr. 6, 2000 (GB) .............................................. 0008546

(51) Int. Cl.⁷ ............................................... G02B 6/10
(52) U.S. Cl. ...................................... 385/129; 385/122
(58) Field of Search ........................ 385/129, 123–125; 359/248, 321; 264/401

(56) References Cited

U.S. PATENT DOCUMENTS

| | | | |
|---|---|---|---|
| 5,187,461 A | * 2/1993 | Brommer et al. | 333/219.1 |
| 5,471,180 A | * 11/1995 | Brommer et al. | 333/202 |
| 5,559,825 A | 9/1996 | Bloemer et al. | |
| 5,748,057 A | * 5/1998 | De Los Santos | 333/134 |
| 5,751,466 A | * 5/1998 | Dowling et al. | 359/248 |

(Continued)

FOREIGN PATENT DOCUMENTS

| EP | 0 810 453 A | 12/1997 |
|---|---|---|
| WO | 98/53351 A | 11/1998 |

OTHER PUBLICATIONS

Fleming J G et al; "Fabrication and Properties of 3–D Polysilicon Photonic Lattices in the Infrared"; Technical Digest of the IEEE International MEMS '99 Conference. 12$^{TH}$ IEEE International Conference on Micro Electro Mechanical Systems. Orlando, Fl.; Jan. 17–21, 1999 IEEE International, Micro Electro Mechanical Systems Conference, New York, NY: IEE, 1999, pp. 366–370, XP000830775.

(Continued)

*Primary Examiner*—Ellen E. Kim
(74) *Attorney, Agent, or Firm*—Nixon & Vanderhye P.C.

(57) ABSTRACT

In order to create an optical device with a photonic band gap extending in two dimensions and with very uniform properties in any direction and for any polarisation state, to within 1%, air holes are etched within a substrate of low refractive index material such silicon oxynitride or silica glass. The ratio of air hole area to the remainder of the substrate is low, being less than 35%. The air holes define a quasicrystal structure, having twelve fold symmetry, being based on a square-triangle system. In another development, an etched substrate with a regular crystal structure or quasicrystal structure exhibits a non-linear refractive index. Two adjacent areas in such a substrate have different lattice properties, or have defects in the lattices, to create a unidirectional transmission path (diode action). A further beam of light may be used to modulate the transmission path by reason of the non-linear refractive index.

38 Claims, 26 Drawing Sheets

U.S. PATENT DOCUMENTS

| | | | |
|---|---|---|---|
| 5,784,400 A | | 7/1998 | Joannopoulos et al. |
| 5,802,236 A | * | 9/1998 | DiGiovanni et al. ......... 385/127 |
| 5,997,795 A | * | 12/1999 | Danforth et al. ............. 264/401 |
| 5,999,308 A | * | 12/1999 | Nelson et al. ............... 359/321 |
| 6,002,522 A | | 12/1999 | Hayase et al. |
| 6,028,693 A | * | 2/2000 | Fork et al. ................... 359/248 |
| 6,262,830 B1 | * | 7/2001 | Scalora ....................... 359/248 |
| 6,538,794 B1 | * | 3/2003 | D'Aguanno et al. ......... 359/279 |
| 6,640,034 B1 | * | 10/2003 | Charlton et al. ............. 385/122 |
| 6,674,778 B1 | * | 1/2004 | Lin et al. ....................... 372/46 |
| 6,683,898 B2 | * | 1/2004 | Østergaard et al. ........... 372/43 |
| 6,710,912 B1 | * | 3/2004 | Filkins et al. ................ 359/326 |
| 2002/0021878 A1 | * | 2/2002 | Allan et al. .................. 385/129 |
| 2002/0059897 A1 | * | 5/2002 | John et al. ..................... 117/84 |
| 2002/0061176 A1 | * | 5/2002 | Libori et al. ................. 385/125 |
| 2002/0181911 A1 | * | 12/2002 | Wadsworth et al. ......... 385/125 |
| 2003/0174940 A1 | * | 9/2003 | Charlton et al. .............. 385/27 |

OTHER PUBLICATIONS

Patent Abstract of Japan, vol. 1999, No. 13, Nov. 30, 1999, & JP 11–218627 A (Nippon Telegr & Teleph Corp & LT; NTT>), Aug. 10, 1999.

* cited by examiner

Fig.15a.
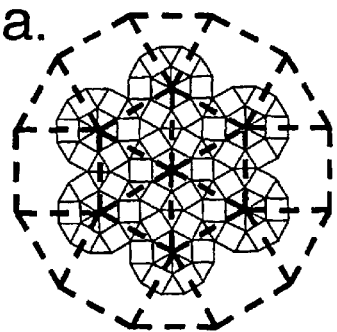
Fig.15b.
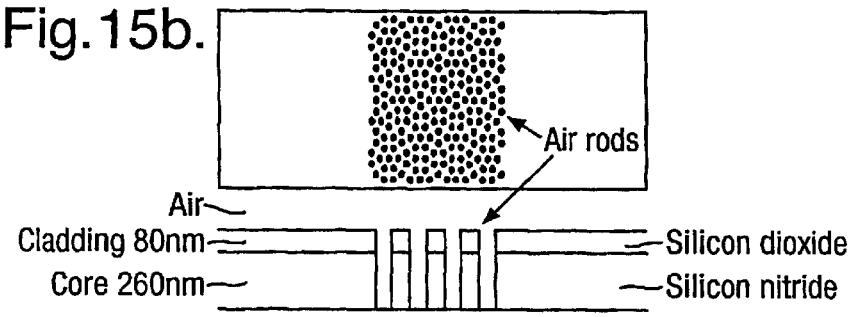
Air rods
Air
Cladding 80nm — Silicon dioxide
Core 260nm — Silicon nitride
Fig.15c.
Buffer 1.70nm — Silicon dioxide
Substrate — Silicon
Fig.16.
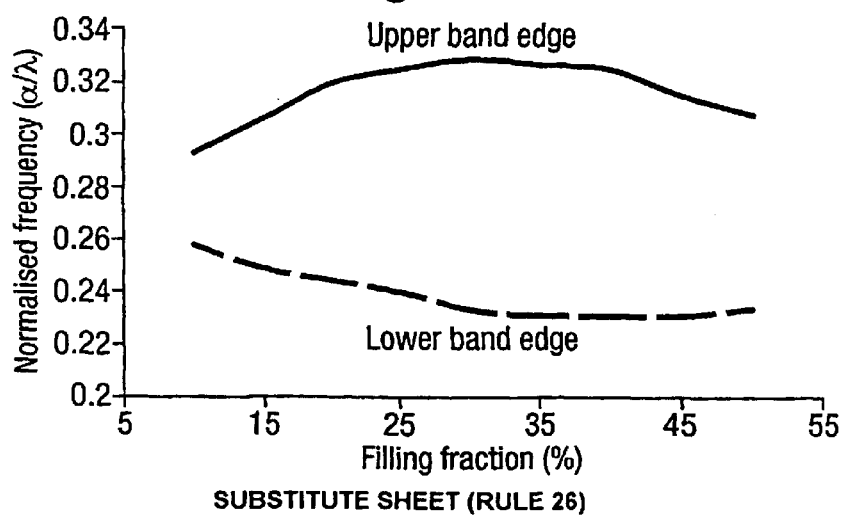

TE modes

TM modes

ΓJ Direction
For TE mode in glass

ΓX Direction
For TE mode in glass

For TE mode in glass

In PQC in Silicon Nitride

Fig.37.

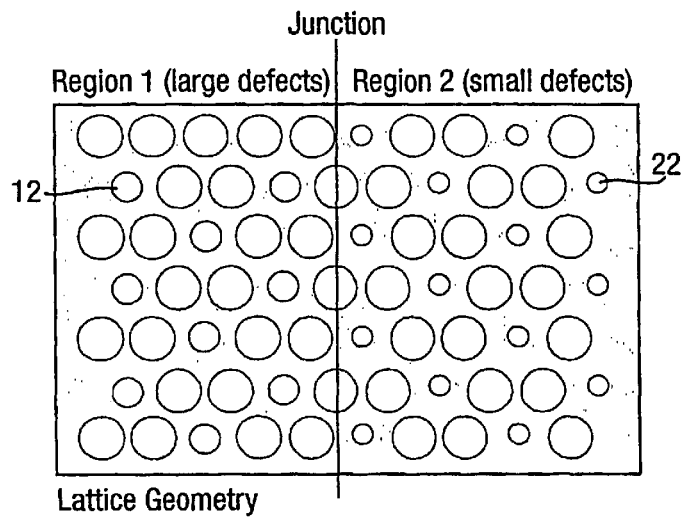

Lattice Geometry

Fig.38.

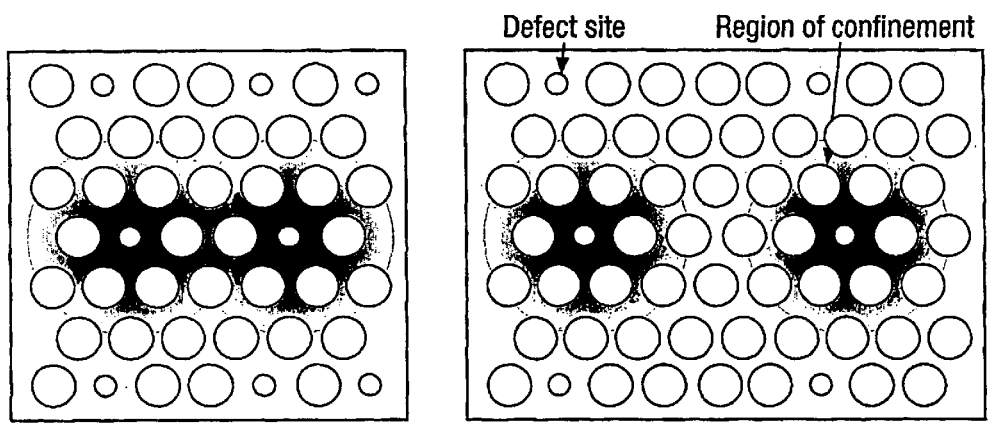

Overlap between evanescent fields associated with neighbouring defect sites leads to strong coupling between defect cavities, and strongly transmissive defect mode within PBG wavelength range.

No overlap between evanescent fields associated with neighbouring defect sites leads to no transmissive defect mode within PBG wavelength range.

OPTICAL DEVICE

This application is the US national phase of international application PCT/GB01/01588 filed 06 Apr. 2001, which designated the US.

This invention relates to optical devices and, in particular, to optical devices incorporating structures exhibiting a photonic band gap.

In our prior application WO 98/53351, there is described a method of controlling the propagation characteristics of radiation in wave guides by means of photonic band gaps. Such devices may be formed by etching a substance which supports propagation of radiation at a wavelength of interest, for example visible radiation. This radiation may be visible radiation or other forms of electromagnetic radiation such as ultra-violet, infra-red and terahertz radiation. In this specification, the term "optical radiation" includes such other forms of radiation.

U.S. Pat. No. 5,784,400 discloses an optical device incorporating a resonant cavity including a planar two-dimensional periodic dielectric structure which exhibits a photonic band gap and a defect in the periodic dielectric structure which gives rise to an electronic mode within the photonic band gap. The photonic band gap effects an in-plane spatial confinement of electromagnetic radiation generated within the structure. Radiation generated within the defect structure may be conducted therefrom by way of a wave guide formed within a photonic band gap region. In an alternative embodiment, a defect may be used to control the frequency characteristics of radiation transmitted from an input wave guide, via the defect structure, to an output wave guide. The devices proposed by U.S. Pat. No. 5,784,400 are, however, essentially linear in their transmission characteristics.

U.S. Pat. No. 5,559,825 proposes a photonic band edge diode constructed using a plurality of first and second dielectric layers. The second dielectric layers are constructed of a material which has a non-linear dependence on the intensity of the incident light and varying path lengths. The layers are arranged in a stack to impart a spatial optical anisotropy to the transmission of radiation therethrough. With such a device, great precision is required in the fabrication of the dielectric layers to produce a desired transmission characteristic. Furthermore, by virtue of their structure, these devices are not readily integrated into circuit arrangements with other optical devices.

SUMMARY OF THE INVENTION

In a first aspect, the present invention provides a method of forming a structure exhibiting a photonic band gap, the method comprising:

providing a material extending in two dimensions, and forming in said material, first regions, having a first refractive index, the first regions being spaced apart by a second region or regions of a second refractive index, the regions defining a quasicrystal exhibiting long range order but short term disorder, and exhibiting n-fold symmetry wherein n is greater than or equal to two, whereby to provide a photonic band gap extending in at least said two dimensions.

In a second aspect, the invention provides a structure exhibiting a photonic band gap, wherein the structure includes a material, extending in two dimensions, comprising first regions of a first refractive index spaced from one another by a second region or regions of a second refractive index in order to provide a quasicrystal exhibiting long range order but short term disorder, and exhibiting n-fold symmetry, wherein n is greater than or equal to two, whereby to create a photonic band gap extending in at least said two dimensions.

The more planes of symmetry possessed by the quasicrystal, the more isotropic are the optical properties of the quasicrystal. The optical properties become generally uniform in all directions, in particular the width and mid-frequency of the photonic band gap. For twelve-fold symmetry, the optical properties are uniform to within 4% or less, and may be uniform to within 1%. In addition the photonic band gap may extend in a third dimension orthogonal to the two dimensions. The photonic band gap becomes uniform for all states of polarisation.

Various forms of quasicrystal are possible, and the quasicrystal may exhibit a variation in only one dimension, in which case it has a low degree of symmetry, two or more. For a quasicrystal having a varying geometry in two dimensions, the quasicrystal may exhibit any degree of symmetry greater than 6, e.g. 10 (Penrose tiling), 15 or higher. In a preferred embodiment, the quasicrystal is based on a random square-triangle tiling system possessing twelve-fold symmetry. This is because such a system possesses a unit cell which lends itself to easy lithographic reproduction in a substrate of material. Structures based on Penrose tiling do not have a unit cell which can easily be replicated for lithographic purposes. As an alternative, the unit cell is based on the known Archimedian tiling.

In a third aspect, the invention provides a method of forming a structure exhibiting a photonic band gap, the method comprising:

providing a material, extending in two dimensions, and having a relatively low index of refraction, less than or equal to three, and forming in said layer first regions, having a first refractive index, the first regions being spaced apart by a second region or regions of a second refractive index, the regions defining a quasicrystal exhibiting long range order but short term disorder and exhibiting an n-fold symmetry where n is greater than or equal to two, whereby to create a photonic band gap extending in at least said two dimensions.

The material of the two dimensional layer may be silicon, germanium, silicon nitride or oxynitride or any of the other semi-conductor materials commonly used in photonic applications for example indium phosphide or gallium arsenide, or compound alloys including these materials, or plastic. As preferred however low index materials such as silicon nitride or silicon oxynitride, or amorphous glass materials such as silica, or plastic, are preferred. A primary advantage of using a low refractive index is that it is easy to couple into the structure light from a waveguide or fiber of glass or other low refractive index material whilst incurring minimal loss or back reflection. In this specification, reference is made to the dielectric constant, which is equal to the square of the refractive index.

In a fourth aspect, the invention provides a method of forming a structure exhibiting a photonic band gap, the method comprising:

providing a material extending in two dimensions and forming in said material first regions, having a first refractive index, the first regions being spaced apart by a second region or regions of a second refractive index, the regions defining a quasicrystal exhibiting long range order but short term disorder and exhibiting n-fold symmetry, wherein n≥12, whereby to create a photonic band gap extending in at least said two dimensions.

The material may extend in three dimensions, and the regions defining the quasicrystal may extend in a third direction perpendicular to the two dimensions. In one embodiment, the quasicrystal structure may form a cladding or the core of an optical fiber, the regions defining the quasicrystal extending along the length of the fibre. In a further embodiment, the regions of the quasicrystal may be formed as a three dimensional array in order to provide a quasicrystal geometry extending in three dimensions. In a further embodiment, the first regions are formed as bars extending in one of the dimensions, and the spacing apart of the bars is non-linear in order to provide the two-dimensional band gap. In a preferred embodiment, the quasicrystal geometry is defined in said two dimensions only.

In a fifth aspect, the invention provides a method of forming a structure exhibiting a photonic band gap, the method comprising:

providing a material, extending in two dimensions, and etching the material to remove material in predetermined areas, the etching extending in a direction perpendicular to said two dimensions, whereby to define first regions having a first refractive index spaced by a second region or regions having a second refractive index, whereby to define a quasicrystal exhibiting long range order but short term disorder and exhibiting n-fold symmetry wherein n is greater than or equal to two, whereby to create a photonic band gap extending in at least said two dimensions, and wherein the ratio of the area of the first regions to the area of the second regions is relatively low, being less than 35%.

The advantage of using a low ratio occurs since the etching process is simplified and are more accurately defined, and operational efficiency is increased.

In a further development, we have developed devices exhibiting a photonic band gap and having non-linear, controllable and/or asymmetric propagation characteristics for electromagnetic radiation, which can be used as switches, transistors and diodes.

According to a further aspect of the present invention there is provided a structure exhibiting a photonic band gap, wherein the structure includes a material having first regions of a first refractive index spaced from one another by a second region or regions of a second refractive index in order to provide a crystal or quasicrystal structure exhibiting a photonic band gap, wherein the structure modifies the properties of the material to induce a significant non-linear effect wherein the refractive index of the structure is dependent upon the power of light incident on the structure.

A surprising characteristic of the present invention is that a material such as silicon nitride, not being markedly non-linear, is modified, in accordance with the invention to possess a significant non-linear effect.

According to a further aspect of the present invention there is provided an optical device comprising a body having at least one path there through for the transmission of optical radiation wherein the transmission characteristics of said radiation when traversing said path are constrained by a first and a second region disposed within said body and comprising a material or materials exhibiting a photonic band gap wherein said first and second regions are positioned relative to one another so that an evanescent field associated with the photonic band gap of said first region interacts with an evanescent field associated with the photonic band gap of said second region to cause is said transmission characteristic to be essentially non-linear, asymmetric or controllable. According to a further aspect of the present invention there is provided an optical device having an optical transmission path through first and second adjacent areas, each area being formed from a material, first regions of a first refractive index spaced apart by a second region or regions of a second refractive index, said regions defining a crystal or quasi crystal structure having a photonic band gap, and each such structure having defects therein to create photonic states within the band gap and associated evanescent fields, the evanescent fields of the first and second areas being coupled so as to permit transmission within the photonic band gap, the transmission characteristic being non-linear or asymmetric.

By arranging for the photonic states to have slightly different energies, a diode action is created, since the light can more easily travel from a higher energy state to a lower energy state, than vice versa. Further the non-linear characteristic of the invention provides a mechanism by which excess energy can be absorbed.

According to a further aspect of the present invention there is provided an optical device having an optical transmission path through first and second adjacent areas, each area being formed from a material comprising, in two dimensions, first regions of a first refractive index spaced apart by a second region or regions of a second refractive index, the regions defining a crystal or quasi crystal structure having a photonic band gap, the photonic band gaps in the two areas having different values, and preferably at least one of the first and second areas exhibiting a non-linear refractive index, whereby light incident on the one area adjusts the band gap value relative to the band gap of the other area.

The structures may exhibit twelve fold symmetry in accordance with the first aspect of the invention; alternatively they may be formed of triangular (six-fold) or square lattices (four fold) having a lower degree of symmetry.

As preferred, at least one area has defect sites there within, consisting of a set of sites having a slightly larger or smaller diameter or refractive index, or different shape, than the bulk of the lattice sites. Alternatively the defects may be caused by a missing lattice site, or a said first region positioned at other than a lattice site. They have the effect of introducing a narrow defect mode within the wavelength range of the photonic band gap created by the crystal. The wavelength of this defect mode is strongly dependent upon defect size.

As preferred defects in the first region are a different size from those in the second region although within each region the defects may be of uniform size. Each defect creates a micro-cavity which may support a localised mode at a wavelength within the photonic band gap. Although the defect mode is localised to the position of the defect it has an evanescent field function associated with it The evanescent fields within the two regions overlap at the boundaries and it becomes possible for photons to become transferred between the regions.

Further in accordance with the invention it has been realised that having defect modes within the two regions will create energy states at different energy values, and hence wavelength values. Thus light may be transmitted from a higher energy state in one region to a lower energy state in the adjoining region, the difference in energy being absorbed in the second region by lattice vibrations etc. However for light travelling in the opposite direction, it is necessary for the light to gain energy to be able to transmit in a higher energy state, and there will not normally be available a mechanism available for absorbing extra energy. Thus the light would be reflected and will not be able to be transmitted in the opposite direction.

BRIEF DESCRIPTION OF THE DRAWINGS

The invention will now be particularly described by way of example, with reference to the accompanying drawings, in which:

FIGS. 15(*a*) (*b*) and (*c*) illustrate the quasicrystal structure in accordance with one embodiment of the invention;

FIGS. 16 to 32 define graphics illustrating the optical properties of the structure of FIG. 15;

FIGS. 37 to 45 are diagrammatic representations of a group of second embodiments of the invention;

DESCRIPTION OF PREFERRED EMBODIMENTS

Figure 1:
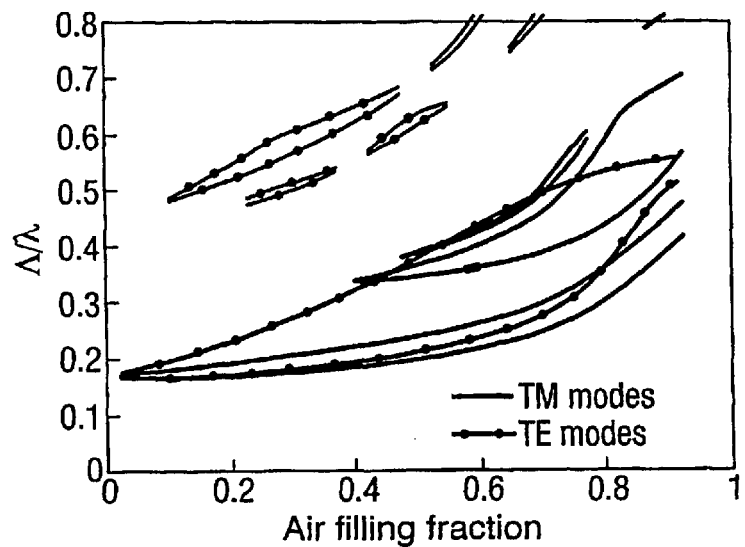
FIGS. 1 to 14 are graphical diagrams illustrating properties of photonic band gap structures of trianglar and square lattices, for use with the invention.

It is a desirable attribute of a photonic crystal that the band gap should extend in preferably any direction in three dimensions and should exist for all states of polarisation, i.e. Transverse Electric (TE) and Transverse Magnetic (TM) states and any combination of the two. This is because if the band gap is non-isotropic then there is a risk of photons leaking out in certain directions.

We have discovered that a two-dimensional periodic structure with finite thickness, may possess a band-gap extending in three dimensions, and that the band gap may remain open for a large range of angles.

Whilst it is possible to provide photonic band gaps in two and three dimensions by means of periodic triangular and hexagonal lattice structures, this can only be done with very high dielectric constant materials, which causes undesirable back reflections and loss when coupling to an optical fiber.

We have discovered structures which provide isotropic band gaps in materials with low dielectric constants. Further where such materials are formed by etching air gaps in a substrate material, only small air filling fractions are required. This helps to reduce scattering losses.

Referring to FIGS. 1–14, the photonic properties of silicon based photonic crystals were determined by two-dimensional plane wave analysis. Photonic band gap air-filling fraction (a.f.f.) maps may be constructed by plotting the edges of the absolute photonic band gap against air-filling fraction. In these diagrams, the islands enclosed by curves indicate the frequency extent of the photonic band gap as a function of rod diameter or air-filling fraction. These diagrams yield useful quantitative information about the behaviour of the photonic band gap as a function of lattice geometry and dielectric constant. Air-filling fraction maps were evaluated for square and triangular arrays of air holes etched in silicon and for the inverse structures (square and triangular arrays of silicon rods in air). For the purpose of generality, the results are scaled in terms of arbitrary wavelength ($\lambda$) and lattice pitch ($\Lambda$).

Directional information about the behaviour of the band gap is retained by evaluating the band gap filling fraction map separately for the two principal directions of symmetry ($\Gamma$-J and $\Gamma$-X), where the most extreme variations in band structure are expected, and superimposing the curves. Regions where the two sets of band gap islands overlap indicate the frequency extent of the complete (non-directional) photonic band gap. Non-overlapping regions indicate partial (directional) photonic band gaps. Although the band structure was evaluated for the two extreme polarisation states (TE and TM) in each case, these data can be used to make predictions about the properties of a photonic crystal for any other linear polarisation state.

If, when linearly polarised light is incident upon a photonic crystal, the wave-vectors are rotated slightly with respect to the plane of the lattice, then both the E and the H wave vector will simultaneously have a component resolved within the plane of the lattice. Consequently, the photonic properties will show characteristics of both TE and TM band structures. The strength of the characteristic would be proportional to the relative amplitude of the respective wave-vectors within the plane of the lattice.

Two-dimensional arrays of air rods (n=1) arranged on a square and triangular lattice etched into silicon (n=3.46) were analysed for a large range of air-filling fractions, for the TE and TM polarisation states separately. Calculations were performed using a grid of $15^2$ lattice points and 61 k-vector samples' for each band diagram, incrementing the air-filling fraction in steps of 2.5% up to the close packing condition at 90%.

Figure 2:
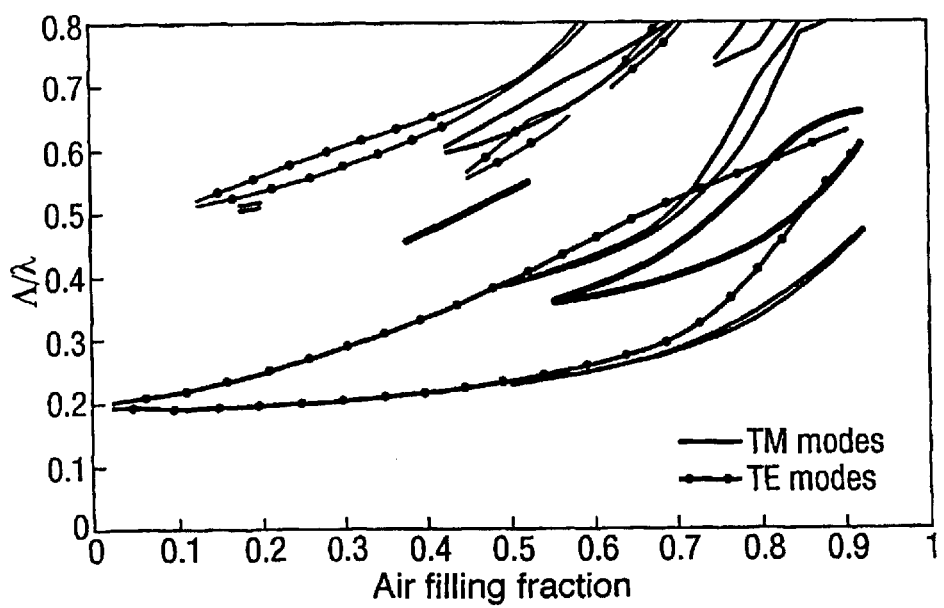
Figure 3:
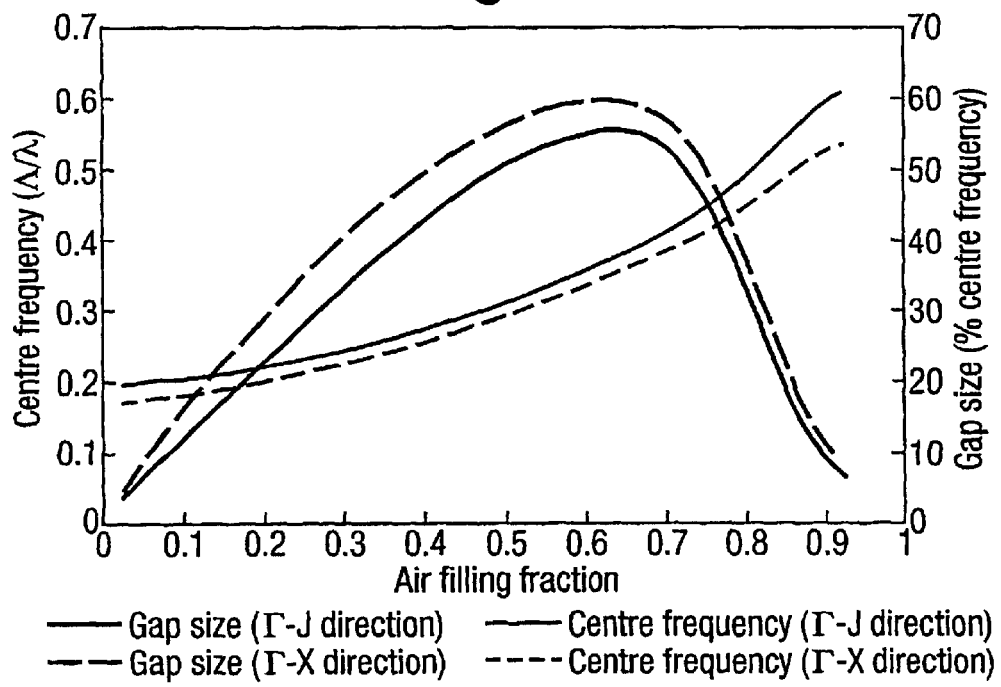

Referring to FIGS. 1–4, three sets of directional partial) band gaps were detected for the TE polarisation state. The largest band gap lies between the lower bands, and its width increases almost linearly with air-filling fraction up to a point where it rapidly starts to close up. This will be referred to from here on as the primary band gap. The primary partial band gap extends over nearly the entire air-filling fraction range for both directions of propagation. The partial band gap is wider for the $\Gamma$-X direction reaching a maximum width of 60% mid gap frequency (m.g.f.) at an optimal air-filling fraction (a.f.f.) of 63%, in comparison to the $\Gamma$-J direction where it reaches 55% m.g.f. at an optimal a.f.f. of 65% (FIG. 3).

The regions where the two sets of directional band gaps overlap indicate the frequency extent of the complete (non-directional) photonic band gap. Due to a small displacement between the partial band gaps at both extremes of the filling fraction range, the filling fraction range for the non directional band gap is slightly reduced, extending from 10%–87% for the primary band gap. Further analysis shows that the non directional primary band gap reaches a maximum width of 55% m.g.f. at an a.f.f. of 65%

Figure 4:
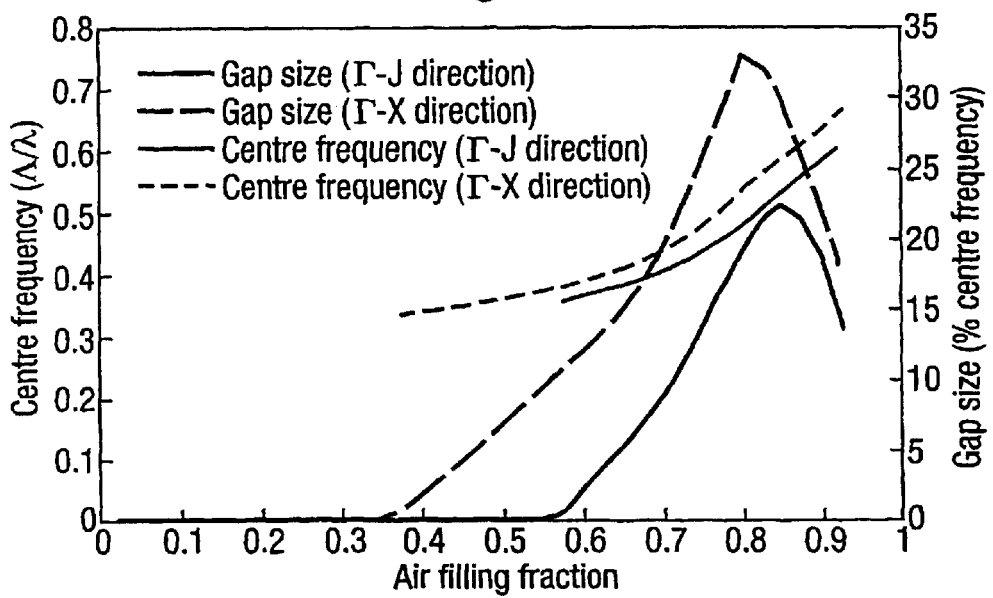

For the TM polarisation state, partial band gaps open between most of the lower bands for one or other direction. However, under these conditions, the partial band gaps rarely overlap. A large partial band gap opens in the $\Gamma$-X direction between bands 1–2 over most of the a.f.f. range. A much larger primary partial band gap opens between bands 2–3. Again this opens at a much lower a.f.f. (37%) for the $\Gamma$-X direction than for the $\Gamma$-J direction (55%) resulting in a small complete band gap for a.f.f. above 55%. This reaches a maximum width of 33% for the $\Gamma$-X direction at an optimal a.f.f. of 78%, and 22% for the $\Gamma$-J direction at an optimal a.f.f. of 85% (FIG. 4).

Super-imposing the a.f.f. maps for the two polarisation states upon one another, non polarisation dependant (absolute) band gaps are indicated by regions of overlap. FIGS. 1, 2 show that a triangular lattice of air holes etched in silicon does in fact possess an absolute band gap. Again, this is larger for the $\Gamma$-X direction than the $\Gamma$-J direction.

Superimposing FIGS. 1 and 2 upon one another (not shown), regions of overlap indicate the frequency positions of non-directional, non-polarisation dependent photonic band gaps. For this structure, a full band gap occurs for a.f.f. above 55%.

Simulation results for a square lattice arrangement have been determined. In this case the primary band gaps for both polarisation states extend over most of the a.f.f. range. Again the partial band gaps for both polarisation states are largest for the Γ-X direction as summarised below:

| Partial band gap | TE polarisation: | | TM polarisation: | |
|---|---|---|---|---|
| | % mid-gap freq. | Air fraction | % mid-gap freq. | Air fraction |
| Γ-X direction: | 45% | 55% | 53% | 88% |
| Γ-J direction: | 15% | 60% | 12% | 70% |

Two-dimensional arrays of free standing silicon pillars in air arranged on a square and triangular lattice were also analysed as a function of air-filling fraction, and polarisation state. Calculations were performed using a grid of $15^2$ lattice points and 61 k-vector samples for each band diagram.

Figure 5:
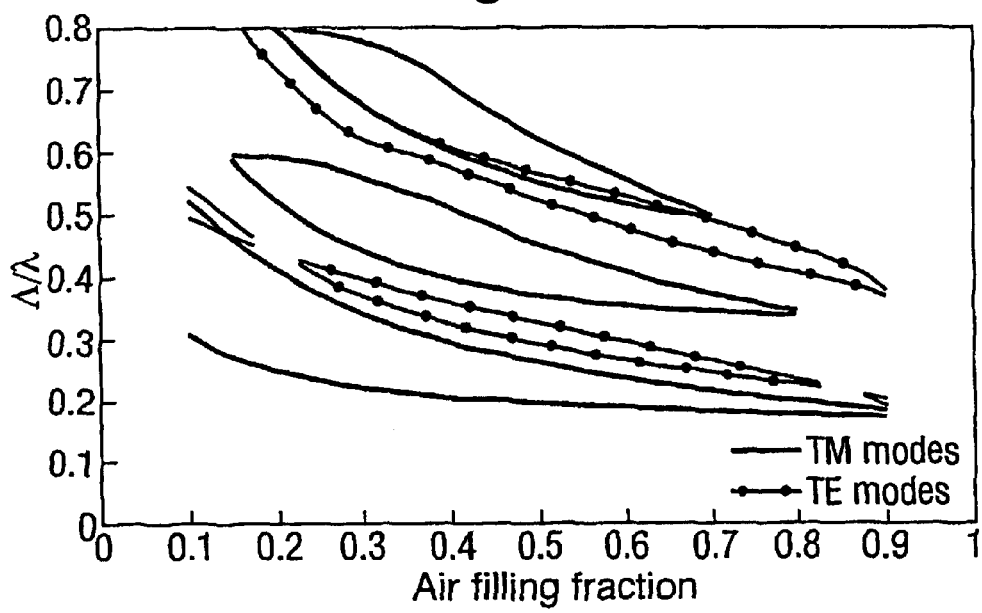
Figure 6:
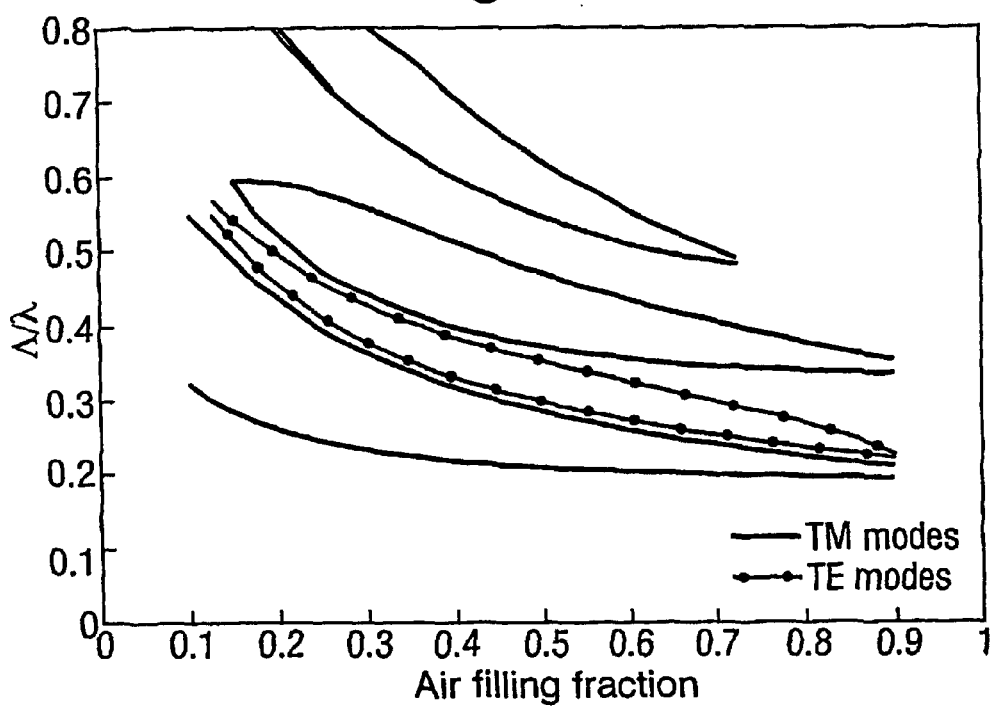
Figure 7:
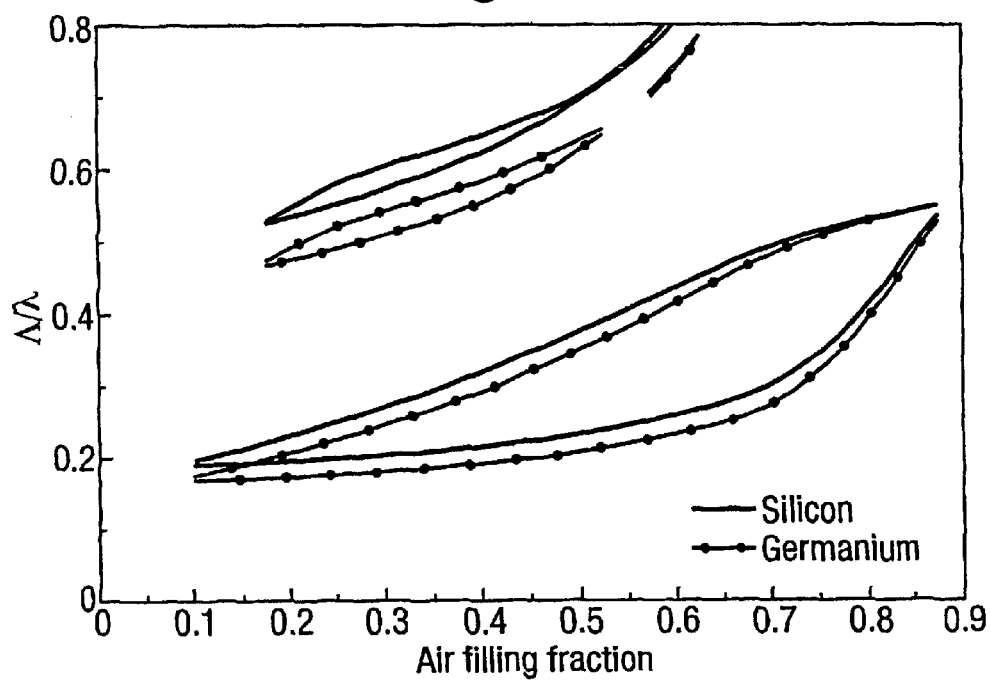
Figure 8:
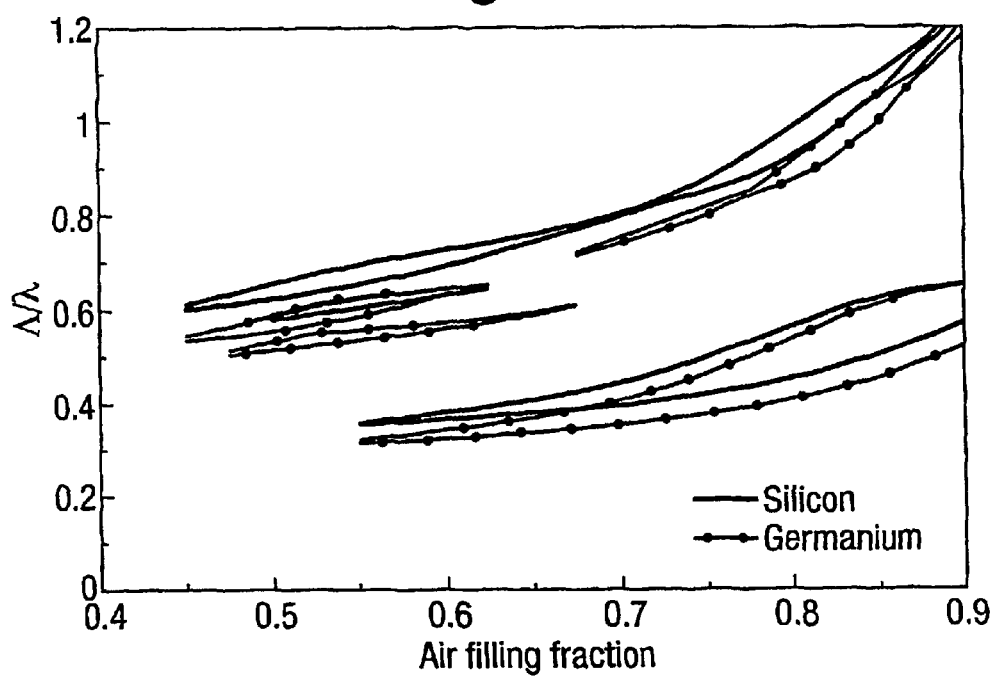

For a structure of silicon rods in air, the band gaps were found to be largest for small air-filling fractions, decreasing in width as the air-filling fraction increases. Simulation results for the triangular lattice arrangement are shown in FIGS. 5 and 6. Two partial band gaps open for the TE polarisation state, extending over most of the air-filling fraction range. There is a small region of overlap in the primary band gap for both directions of propagation indicating a non-directional band gap for a.f.f. in the range 22% to 80%. However, this is relatively small (10% at optimal a.f.f. of 45%).

There are three large non-directional band gap regions for the TM polarisation state. These occur for air-filling fractions in the range 2%–82%, 15%–82%, 25%–70% respectively. The largest (primary) band gap opens between bands 1–2 reaching a width of 48% at an optimal a.f.f. of 12.5%.

There are virtually no regions of overlap between the two polarisation states for either direction of propagation, and so the structure does not possess a non-polarisation dependent band gap.

Simulation results for a square lattice of Silicon rods in air have been determined. For the TE polarisation state, small partial band gaps open between bands 4–5 and 6–7 for both directions. This time the partial band gaps are widest for the Γ-J direction, extending over most of the a.f.f. range. The primary partial band gap for the Γ-J direction reaches a maximum width of 15% m.g.f. at an optimal a.f.f. of 33%, whereas the partial band gaps for the Γ-X direction are comparatively small (<8%).

For the TM polarisation state, three large partial band gaps open up between bands 1–2, 3–4, 6–7 for much of the a.f.f. range. This reaches a maximum width of 51% m.g.f. and 53% m.g.f. for the Γ-X and Γ-J directions respectively at an optimal a.f.f. of 16% for both. There are large areas of overlap between the band gap islands for the two directions in each case, indicating non-directional band gaps for a.f.f. in the ranges 3%–62%, 19%–63%, 25%–65% respectively. This structure does not support a full non-directional non-polarisation dependent band gap.

The photonic properties of square and triangular arrays of air holes etched into germanium were also analysed. Germanium has a significantly larger refractive index than silicon (n=4) and so was expected to yield significantly larger photonic band gaps, but in fact had gaps similar to those for silicon.

A comparison was also made between the properties of identical silicon and germanium photonic crystals. This was implemented by analysing the properties of the non-directional band gaps for the triangular lattice arrangement of air holes. The most striking aspect of the band structures (FIGS. 7 and 8) is that there is really very little change in the size and position of the lower band gap for either polarisation state and for any volume air-filling fraction, despite the large increase in dielectric contrast for germanium.

For small air-filling fractions, there is a small displacement between the band gap regions for the two materials, (the general energy level of the band gap being slightly lower for germanium). As the air-filling fraction increases towards the close packed condition, the two areas converge.

The displacement between band gap regions is more pronounced for the higher order band gap regions for both polarisation states. Although these areas do not converge as the gap closes up, it would appear that the main effect of the variation in dielectric contrast is to change the size and shape of the higher band gap region for the TM polarisation state.

In practical terms, the frequency displacement means that the dimensions of a germanium structure would be marginally smaller than that required for silicon to produce a band gap at a given centre wavelength.

An optimum filling fraction (at which the band gap is at its maximum width) occurs at an air-filling fraction of 65% for the TE-polarisation state and 84% for the TM polarisation state. At these points, the band gap for germanium is only 6.5% and 8.4% larger than that for silicon. At all other air-filling fractions, the gain in band gap width is considerably smaller.

Although the dielectric constant for germanium is significantly greater than that for silicon, the consequent gain in band gap width is surprisingly small. Silicon has a major advantage over germanium in that it is well suited to the optical communications window at 1.5 $\mu$m. Pure germanium is only suitable for PBG devices operating above 2 $\mu$m.

A square lattice of silicon rods (n=3.46) embedded in silicon dioxide (n=3.5) was evaluated. The small reduction in dielectric contrast was found to cause the TE polarised band gap to vanish altogether. Partial band gap maps for the TM polarisation state were exhibited. Investigation was made into the behaviour of the primary band gap for large variations in dielectric contrast. Filling fraction maps were calculated for a triangular lattice of air holes embedded in a dielectric block, using a range of values for the dielectric constant (2–16, incremented in steps of 1). To speed the calculations (running on a P90) up to a reasonable level, calculations were performed at using a grid of $13^2$ reciprocal lattice points. This is sufficient to give accurate position of the lower bands (<5%) and reveal general trends and relationships.

Referring to FIGS. 9–14, for a triangular lattice of air holes, the width of the primary band gap is presented as a three-dimensional surface graph, allowing the width of the primary band gap to be related to both air-filling fraction and $\epsilon_b$ (equal to square of refractive index n.). To clarify the behaviour of the band gap, line graphs are also presented. These show the behaviour of the band gap for just one variable at a time.

Figure 9:
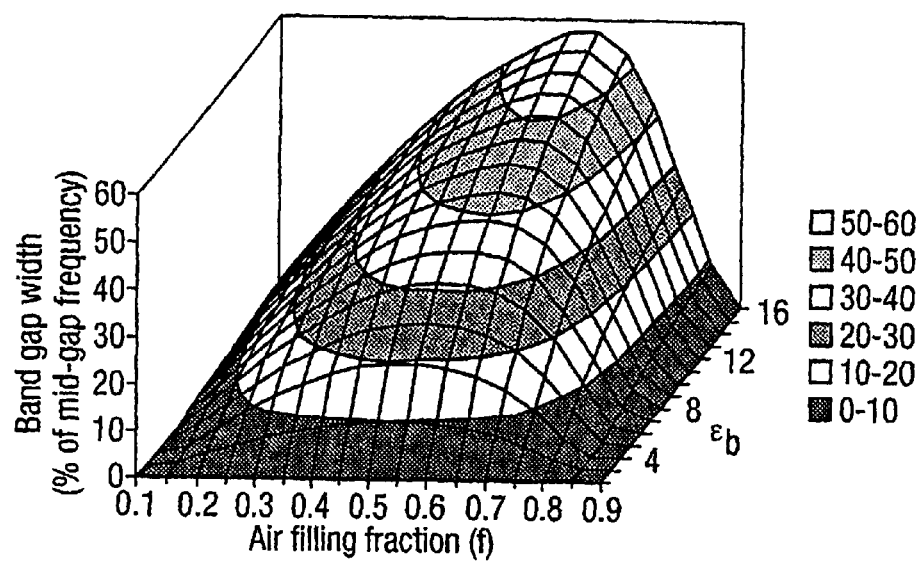
Figure 10:
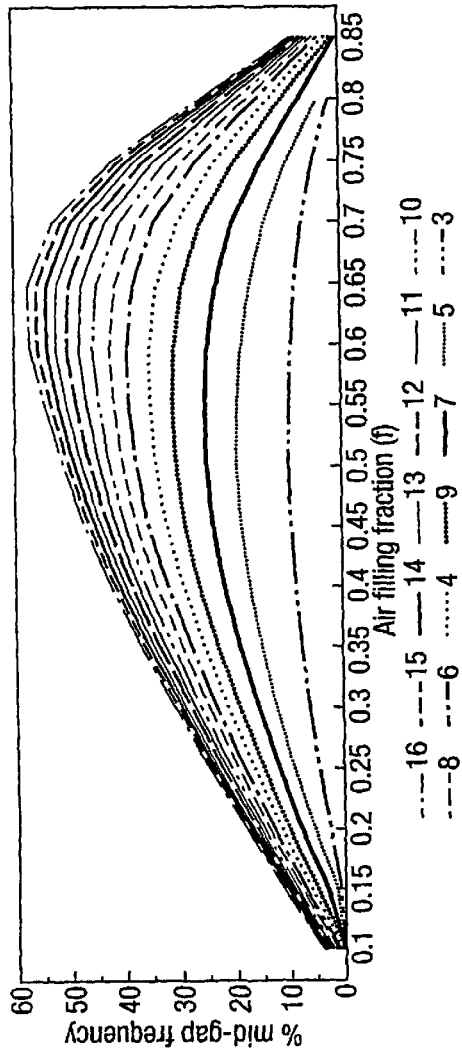
Figure 11:
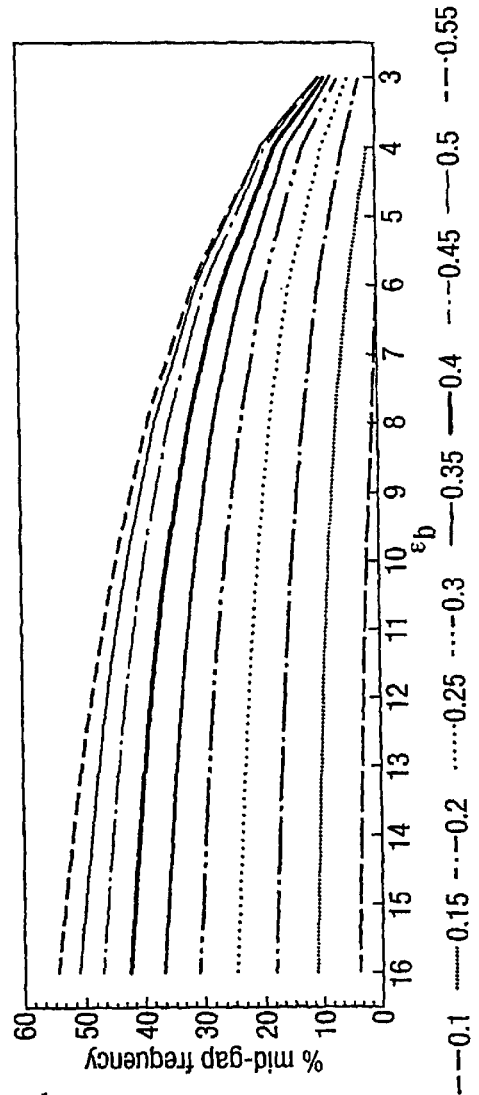

FIGS. 9–11 show the size of the primary TE polarised photonic band gap as a function of air-filling fraction and dielectric constant ($\epsilon_b$). At an optimal a.f.f. of 55%, the primary band gap is found to open up almost immediately as $\epsilon_b$ increases above 2.25. This is a surprisingly low value indicating that a non-directional (complete) TE polarised photonic band gaps may be created using materials with refractive indexes as low as 1.5.

From FIG. 10 the size of the band gap is seen to take the same asymmetric parabolic shape with respect to the air-filling fraction, for all values of $\epsilon_b$. The size of the band gap increases most rapidly for small values of $\epsilon_b$ where the band gap starts to open up, reducing slowly as $\epsilon_b$ increases. The optimal filling fraction shifts linearly by approximately 10% as $\epsilon_b$ increases from 2–16.

FIG. 11 indicates that the band gap grows extremely slowly, but nearly linearly with $\epsilon_b$ for small air-filling fractions and large values of $\epsilon_b$.

Figure 12:
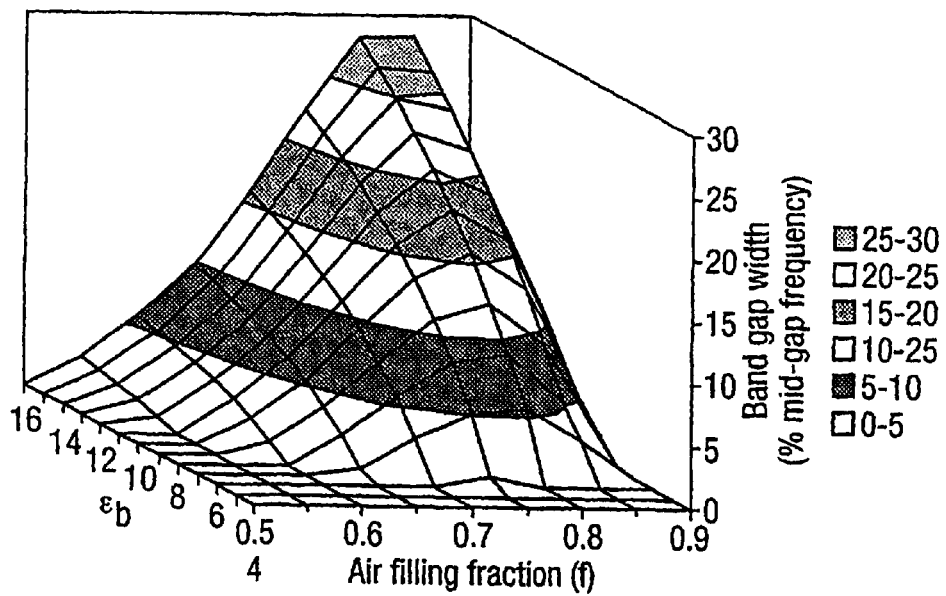
Figure 13:
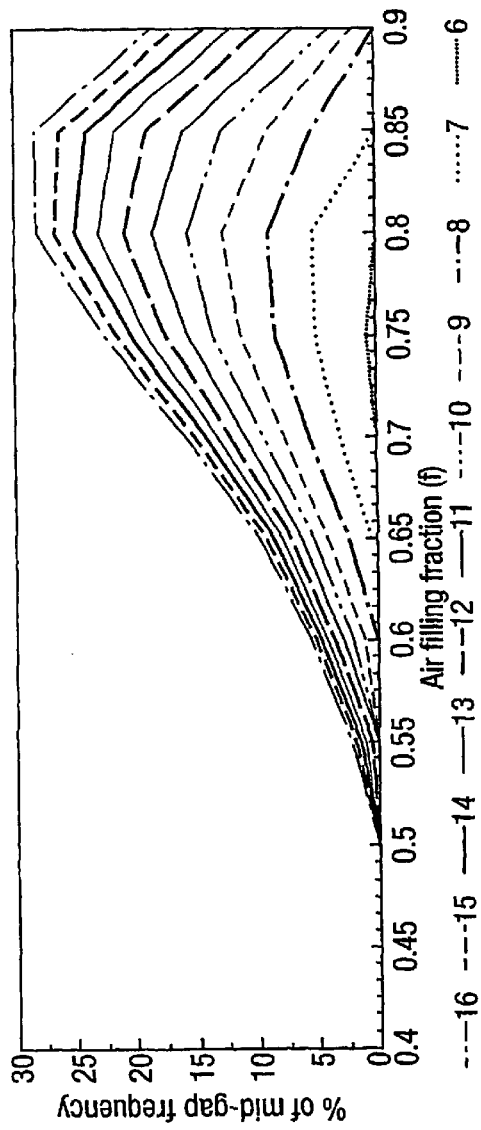
Figure 14:
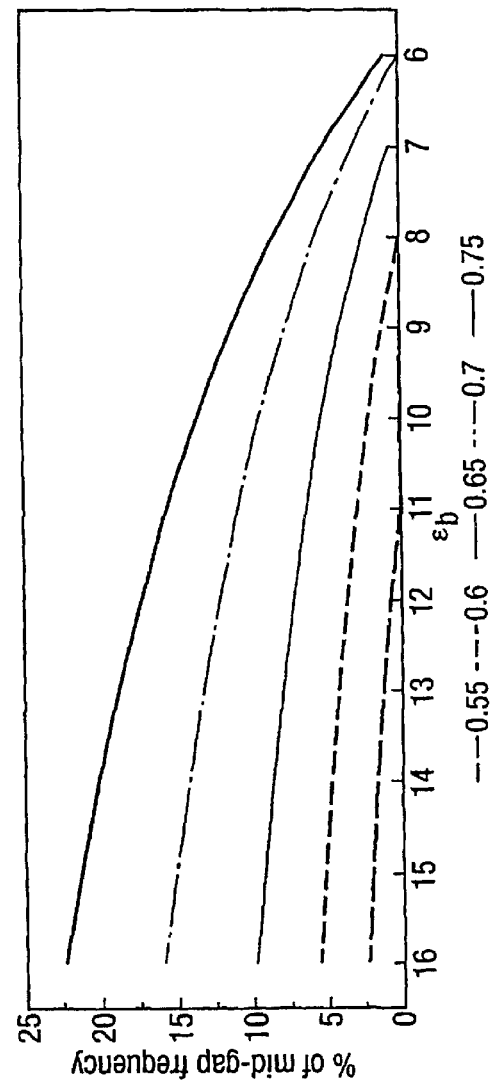
Figure 17:
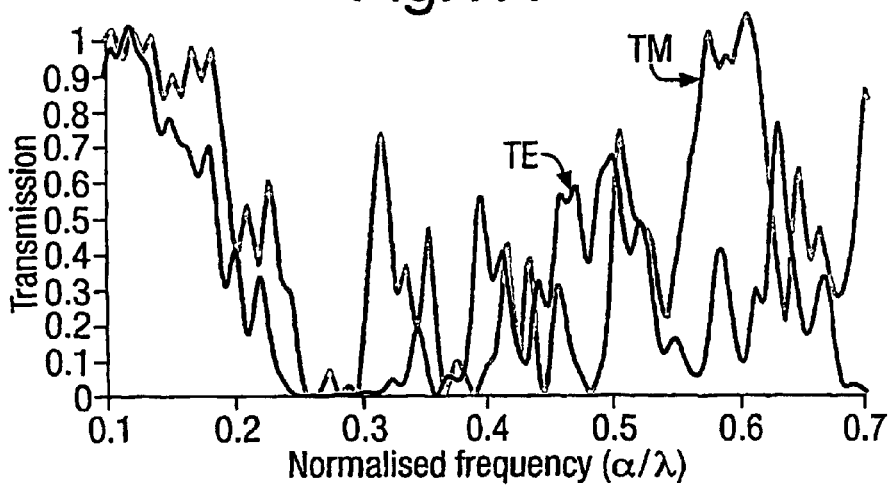

FIGS. 12–14 show the behaviour of the TM polarised primary band gap as a function of $\epsilon_b$ and air-filling fraction. The primary band gap for the TM polarisation state first starts to open for a minimum value of $\epsilon_b$ of approximately 6 (n=2.45) at an optimal air-filling fraction of 75%. In contrast to the behaviour of the TE polarised band gap, the band gap quickly broadens in air-filling fraction range as $\epsilon_b$ increases.

From FIG. 13 the size of the band gap is seen to take the same asymmetric parabolic shape with respect to air-filling fraction, for all values of $\epsilon_b$. As was the case for the TE band gap, the TM polarised band gap increases in size most rapidly for small values of $\epsilon_b$ and the optimal a.f.f. increases linearly by 8% over the test range for $\epsilon_b$.

FIG. 14 indicates that the primary band gap grows nearly linearly with $\epsilon_b$ for small air-filling fractions and large values of $\epsilon_b$.

Another important property of the photonic band gap is the variation in centre frequency as a function of $\epsilon_b$. For the TE-polarisation state, the centre frequency shifts with $\epsilon_b$, but only very slightly for a given air-filling fraction. The shift is very linear up to the optimal air-filling fraction, especially for larger values of $\epsilon_b$. For the TM-polarisation state the shift in mid-gap frequency is near linear over the larger air-filling fraction range for the TM polarisation state. The shift in centre frequency is near linear with $\epsilon_b$ as was the case for the TE polarisation state.

As a set, FIGS. 9–14 can be used to predict the properties of the photonic crystal based on a triangular lattice fabricated from any common semiconductor or optical material.

Simulations and experiment show that a nominally two-dimensional periodic structure with finite thickness, can posses a band gap extending to three-dimensions. This band gap can remain open for a large range of angles, and for high dielectric materials may open for both polarisation states simultaneously. It is therefore unnecessary in many cases to fabricate a truly three-dimensional structure to exploit the three-dimensional properties of the band gap.

First Embodiment of the Invention

For many applications involving the use of photonic crystals it is desirable to acquire complete and absolute photonic bandgaps. In the case of such photonic band gap structures, the wave propagation is forbidden for any direction of propagation, and independent of the polarisation state. This provides a preferred photonic band gap structure for the use in applications such as the inhibition of spontaneous emission and polarisation independent devices. Periodic triangular and hexagonal lattice structures can support complete photonic bandgaps in two and three dimensions. However, as shown in FIGS. 9–14, complete and absolute photonic band gaps (CAPBGs) have only been achieved in very high dielectric constant materials like GaAs ($\epsilon$=13.6) using hexagonal or triangular lattice structures. The frequency range of the bandgaps formed by such a structure is also highly dependent upon the direction of wave propagation, hence the structure is not suitable for all applications. Furthermore, large air pore diameters (large air filling fractions) are required to create even small complete and absolute photonic band gaps. We have found that increasing the air filling fraction can increase the losses of photonic crystals due to the escape of light from the top of the surface.

To alleviate such problems, the search for isotropic bandgaps (that is direction independent) in materials with low dielectric constants and small air filling fractions was undertaken. The use of low index materials facilitates the creation of novel optical devices which are highly compatible with optical fibre network systems. Such devices could include polarisation insensitive, direction independent wavelength division multiplex filters and multiplexers. We have devised a new class of structure which is shown to possess a non-directional polarisation insensitive complete and absolute photonic band gap for a relatively low index material (silicon nitride $\epsilon$=4.08) and a relatively low air filling fraction ($\beta$=0.28).

The anisotropy of the photonic band gap may be shown to be dependent on the symmetry of the photonic crystal lattice. This can be readily verified when band diagrams for photonic crystals possessing a square lattice (four-fold symmetry) and a triangular lattice (six-fold symmetry) are compared. It is noticed that the higher symmetry triangular lattice photonic crystal has a more isotropic photonic band gap as opposed to the square lattice structure.

As the order of symmetry in the photonic crystal increases, the Brillouin zone (BZ) becomes more circular. The highest level of symmetry found in natural crystals is six, however much higher orders of symmetry may be achieved in quasicrystals. Quasicrystals may be fabricated artificially. High orders of symmetry have a tendency to increase the likelihood of the formation of degenerate states. This, in turn, may reduce the overall photonic band gap width due to available energy states coinciding within the photonic band gap. However, we have found that due to the highly isotropic structure of the photonic band gap, larger complete and absolute photonic band gaps can be achieved even though the overall photonic band gap width for specific wave propagation directions maybe reduced by the degenerate states.

In real space a quasicrystal does not possess the same periodic nature as a crystal and exhibits short-range disorder. It is surprising to discover that a disordered arrangement of atoms gives rise to Bragg peaks in Fourier space. However, the real space approximant of any quasicrystal will always possess some form of long range periodicity. This combination of properties provides the quasicrystalline structure with some characteristics derived from the regular crystal behaviour (seen in reciprocal space) and some other features from the disorder properties (as seen in real space). Hence the combination of partial randomness and long range periodicity gives rise to unusual optical characteristics.

Because of the simple short-range disorder differences between quasicrystals and crystals, the Brillouin zone (BZ) can no longer be defined. However, a region termed a (pseudo)-Jones zone (pseudo-JZ) can be defined for a quasicrystal. The is pseudo-JZ is the region in reciprocal space bounded by the perpendicular bisectors of the vectors joining the origin to the dominant scattering vectors. The JZ and the BZ possess many similar features and gives some form of comparison between regular periodic crystals and their quasicrystalline counterparts. The most important analogy being that a Bragg wave vector lying along a pseudo-JZ will experience Bragg reflections similar to those along the BZ boundary in a regular PC. Even finer details such as the fulfilment of the translational symmetry in the BZ are also compatible with that of the pseudo-JZ. In the case of the pseudo-JZ, however, the absolute magnitude of the Bragg peaks during translational symmetry is not satisfied.

A quasicrystal is a maximally random ensemble that comprises random tilings. Under a suitable formulated decoration scheme, every such tiling corresponds to an atomic structure. A random-tiling model plus a decoration scheme constitutes a physical model that specifies the atomic structure of a random quasicrystal.

Quasicrystals possess striking similarities to regular lattice structures in which they maintain long-range periodic scattering of light even though the short-range orientational order of the structure is not periodic. This is necessary for the formation of photonic bandgaps. This provides a means of altering the symmetry of the photonic crystal in order to generate more isotropic Brillouin zones.

Quasicrystals have been determined for a 10-fold symmetry based on Penrose Tiling. Penrose Tiling is a well known form of quasicrystal formed by adjacent Rhomboids having different angles. Whilst such an arrangement will provide in accordance with the invention a more favourable photonic band gap structure, nevertheless there is a problem in that the tiling cannot easily be reproduced in a crystal, because there is not a unit cell, or something approximating to a unit cell, which can easily be replicated by lithographic techniques over the surface of the crystal. It is therefore difficult to fabricate a crystal based on Penrose Tiling.

A photonic quasicrystal based on the random square-triangle tiling system possessing twelve-fold symmetry is proposed. This structure is compatible with integration in a silicon nitride wave guide and is intended for optical characterisation in the visible/near infrared region of the electromagnetic spectrum, where a range of laser sources was available.

The photonic quasicrystal structure is generated by using a random ensemble of squares and equilateral triangles. The random-Stampfli inflation rule is applied to the ensemble of squares and triangles to generate the highly symmetric nature of the quasicrystal. In order for the structure to exhibit long-range twelve-fold symmetry, several recursions of the random-Stampfli inflation rule are required. A complete reference to the Random-Stampfli inflation method for the generation of a maximally random square-triangle tiling is presented in M. Oxborrow et al. [Phys Rev B48 (No. 10) 6966 (1993)]. The dashed lines in FIG. 15(a) demonstrate the parent dodecagon unit cell used for the inflation scheme. The solid lines show the tiling of the offspring dodecagons in the dilated parent cell. The ensemble of squares and triangles residing in any parent dodecagon can take up two unique orientations. This can be achieved by the application of a 30 degree rotation on the parent dodecagon. Hence, a degree of randomness is incurred on the structure by the selection between normal and rotated parent dodecagon unit cells before the application of the inflation rule. During the inflation scheme, the parent dodecagon is reduced in size by a ratio of $(\sqrt{3})+2$ to give rise to the offspring dodecagons. The centres of the offspring dodecagons are superimposed onto the vertices of every square or triangle in the parent unit cell. The air pores of the photonic quasicrystal are located at the vertices of every square and triangle. The distance between neighbouring air pores is defined by the pitch a. FIG. 15(b) shows the resulting arrangement of the air-rods in the dielectric material to be investigated, alongside FIG. 15(c) which shows the cross section of the waveguiding structure. The structure comprises a substrate of silicon having a buffer layer of silicon dioxide, and an epitaxial layer of silicon nitride thereon. A further cladding layer of silicon dioxide is disposed on the silicon nitride. Both the cladding layer and the silicon nitride layer are etched to provide air pores.

The process of formation is as follows;

a standard silicon substrate is thermally oxidised to create a 1.8 µm thick silicon dioxide buffer layer of reduced refractive index (n=1.46), a 250 nm thick silicon nitride layer with a higher refractive index (n=2.02) was deposited by Low Pressure Chemical Vapour Deposition (LPCVD) to form the waveguide core, and a thin (75–180 nm) silicon dioxide cladding layer, also deposited by LPCVD finally provides a degree of mechanical protection from scratches and dirt.

The photonic crystal was introduced into the waveguide structure as follows;

The wafers were patterned by direct write electron beam lithography and plasma etched to create (in this case) cylindrical holes extending down to the core/buffer interface. The wafers were finally cleaved up into individual devices for optical testing.

As an alternative, a method of etching is described in our application WO98/53351. Another viable method for the fabrication of photonic crystals is anodic etching which may be used for the fabrication of silicon-based photonic crystals with an optical band gap in the near infra-red region of the spectrum (1.21–1.7 µm. Porous silicon is formed by etching crystalline silicon under anodic biasing conditions in a weak solution of hydrofluoric acid (HF).

Thus it may be seen that because the structure shown in FIG. 15 has a unit cell, it lends itself to replication in a crystal by forming for example air holes at the apices of the unit cell structure. In a lithographic procedure, a basic unit cell is generated by an e-beam, and an adjoining unit cell is defined by rotating coodinates through 30 degrees.

The photonic quasicrystals examined are composed of 180 nm diameter air rods arranged on a pitch a of 300 nm, surrounded by a 260 nm sandwich of silicon nitride in silicon dioxide to confine the light in the two-dimensional plane.

Transmission plots for all wave propagation directions were calculated using the two-dimensional FDTD method. The FDTD method was based on a centred difference spatial step scheme and an exponentially decaying absorbing boundary condition was applied. A discretised form of Maxwell's equations was used to describe the electromagnetic field inside the dielectric medium. A centred difference spatial step was implemented to minimise transport errors of scattered waves inside the structure. The photonic band gap structure was discretised using a grid of 1000×1000 nodes across 30 rows of the structure. The spatial increment (Δh) was set to λ/50 with respect to the minimum wavelength considered λ=350 nm. The time increment (Δt) was fixed at Δh/50 c with respect to Δh, where c is the speed of light in a vacuum.

The initial input fields were composed of Gaussian wavepackets in the spatial domain. Sampling points at the output of the photonic quasicrystal collect the field profile of the required electric or magnetic field component as a function of the sampled time. A Fast Fourier Transform (FFT) algorithm is applied to the collected data to provide the transmission characteristics for the photonic quasicrystal. The transmission plots are normalised to a control simulation for propagating Gaussian wavepackets in the dielectric medium.

14000 data points are collected at each sampling node to provide enough resolution for the FFT.

For the calculation of the transmission at angles not normal to the plane of incidence, the photonic quasicrystal is rotated about its centre to the desired angle and subsequently the finite differencing mesh is applied to the structure.

FIG. 16 shows the theoretically predicted bandgap size as a function of the air-filling fraction ($\beta$) for normal incidence ($\Gamma$J) to the photonic quasicrystal. The photonic quasicrystals modelled had a constant pitch $\alpha$=300 nm. The dielectric constant for silicon nitride core medium was $\epsilon_b$=4.08. It is noticed that even for very small $\beta$ values a bandgap opens up in the photonic quasicrystal. At $\beta$=10% a gap-midgap ratio of 12.9% is calculated for the $\Gamma$J propagation direction, while for a simple triangular lattice with the same filling fraction and the same dielectric material, a gap-midgap ratio of 2.5% is calculated for the $\Gamma$J propagation direction. Even though the simulations are only for $\Gamma$J directions, due to the high isotropy of the photonic band gap the bandgap remains open for all wave propagation directions, contrary to the triangular photonic crystal structures.

Further simulations were undertaken to highlight the degree of isotropy of the photonic band gap. A photonic quasicrystal having a pitch spacing of $\alpha$=300 nm and an air filling fraction of $\beta$=28% was investigated. Transmission spectra were calculated for several different directions of propagation between $\Gamma$J and $\Gamma$X. using the FDTD method. FIG. 4 shows the transmission for both TE and TM polarised modes along the $\Gamma$J direction. Maximum variations of 4% were observed between different wave propagation directions. For clarity only the direction with the most extreme photonic band gap variation is shown. The overall width of the complete photonic band gap is in-between 0.247 a/$\lambda$) and 0.302 a/$\lambda$. The gap-midgap ratio ($\Delta\omega/\omega_o$) for the TE mode propagation is 27%, while that of the TM modes is 20%. However, it is evident that the TM bandgap lies in the middle of the TE band-gap domain. This gives rise to a 74.1% overlap in the complete photonic band gap for the two different polarisation states as opposed to no complete and absolute photonic band gaps for triangular and hexagonal lattice structures for the same air filling fraction. In the long wavelength limit (normalised frequencies, $\omega a/2\pi c$, less than 0.15) the transmission extends out to unity. At these wavelengths the fine structure of the square-triangle tiling is not resolved by the propagating waves, and the quasicrystal is seen as a homogeneous material of reduced refractive index.

Figure 18:
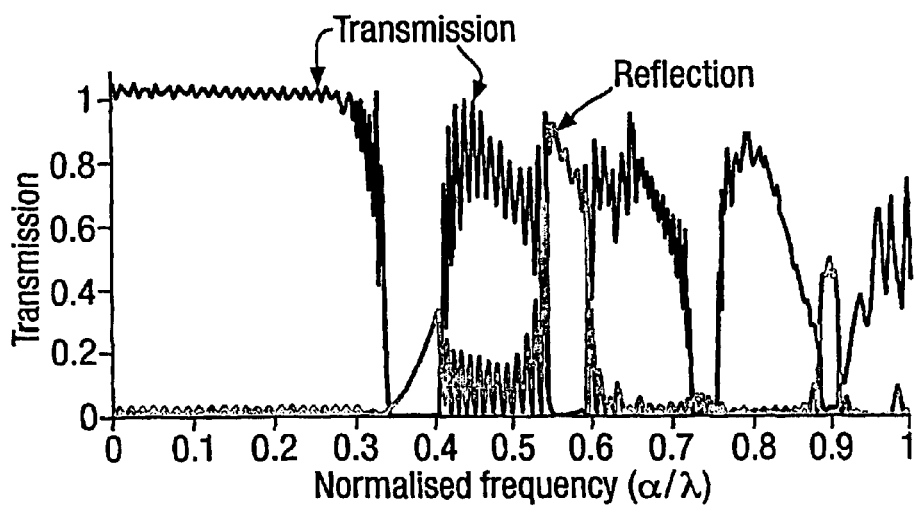
Figure 19:
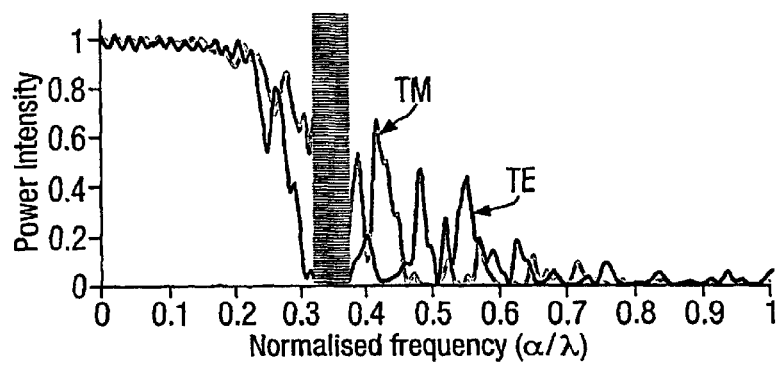
Figure 20:
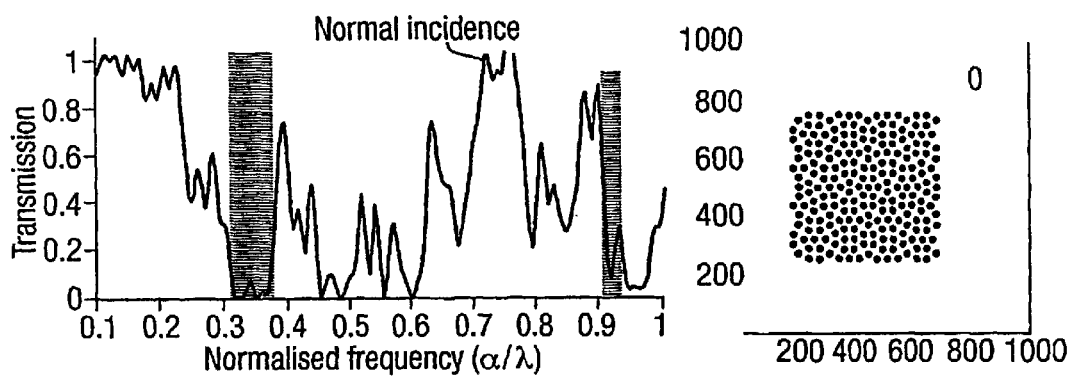
Figure 21:
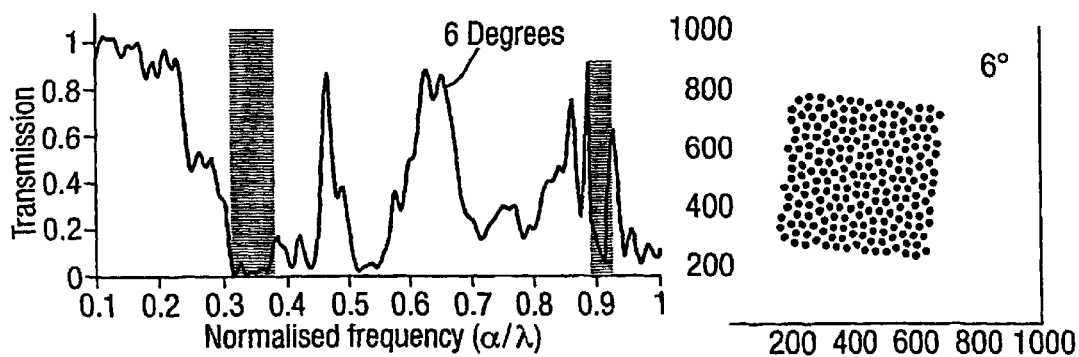
Figure 22:
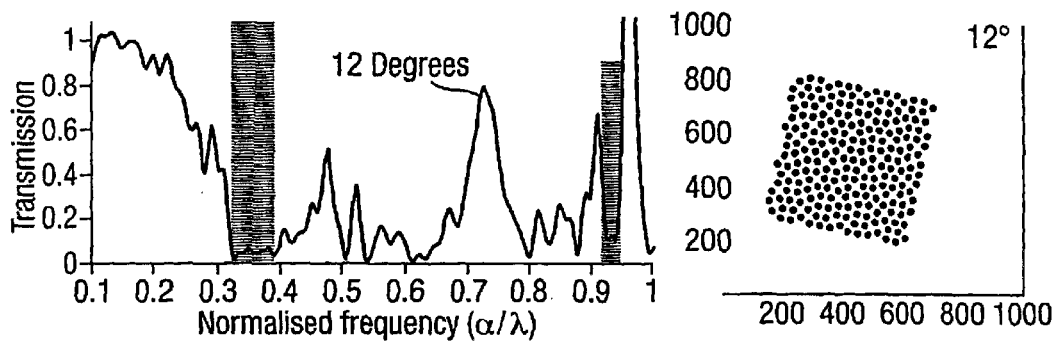
Figure 23:
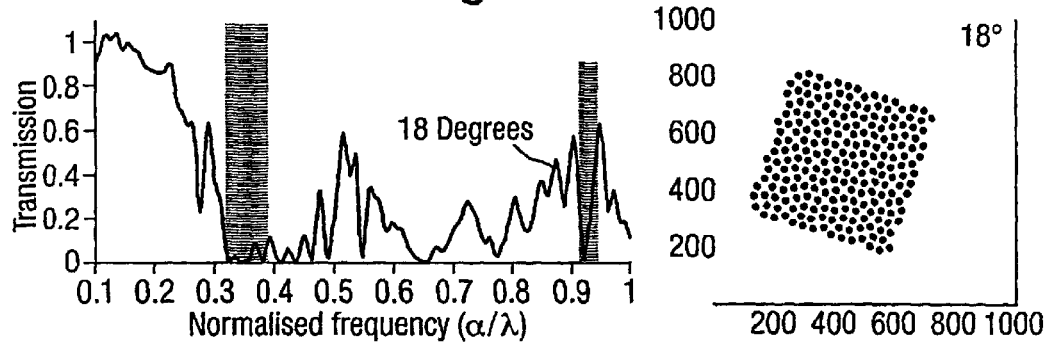
Figure 24:
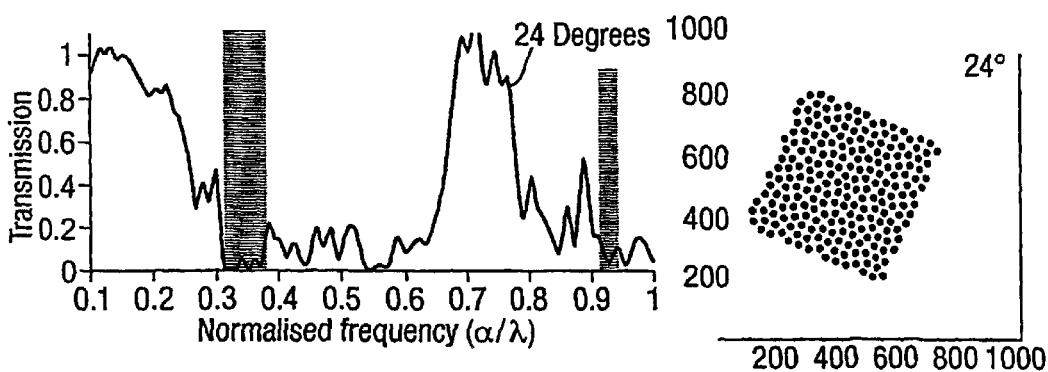
Figure 25:
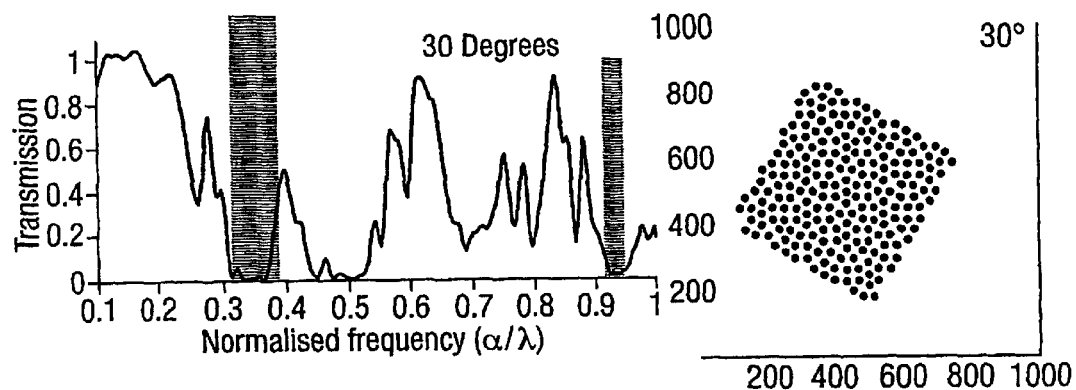

FIGS. 18 and 19 compare a 12-fold symmetric crystal with a triangular lattice with 32% air filling fraction. As can be seen, a PBG also exists for a PQC (Photonic Quasi Crystal). Additionally the PBG of the TE and TM mode are observed to completely overlap in frequency. The PBG persists from 0.316 to 0.380 along the $\Gamma$J direction. The normalised width of the primary PBG is $\Delta\omega/\omega_0$=18.4% for TE modes and $\Delta\omega/\omega_0$–14.3% for TM modes. The overlap for both the TE and TM modes is calculated at 78.1%. Thus PBG is maintained for all wave vector propagation directions and is in contrast to conventional triangular lattice periodic PCs of the same air-filling fraction and dielectric contrast, where no overlap in the complete PBG is observed.

The bandgaps are also noted to occur at lower frequencies compared to triangular and hexagonal photonic crystals. In FIG. 14, the normalised frequencies at the centre of the bandgap ($\omega_o$) for TE and TM polarised light are 0.273 and 0.275 respectively. In contrast to regular lattice structures, nearest neighbour lattice vectors no longer define the Brillouin zone. The Brillouin zone in reciprocal space is defined by the dashed parent dodecagon in FIG. 15($a$) which joins lattice vectors several periods away.

FIG. 20 to FIG. 25 all demonstrate the change in near-field transmission characteristics for different angles of propagation of TE modes. The shaded region highlights the persistence of the PBG for all angles. The irreducible pseudo-JZ indicates that due to the symmetry of the quasicrystal, characteristics centred about 15 degrees should be identical, for example, the transmission properties of 12 and 18 degrees relate very closely. Thus the properties of the quasicrystal are essentially isotropic, being the same to within 1% for any direction.

Figure 27:
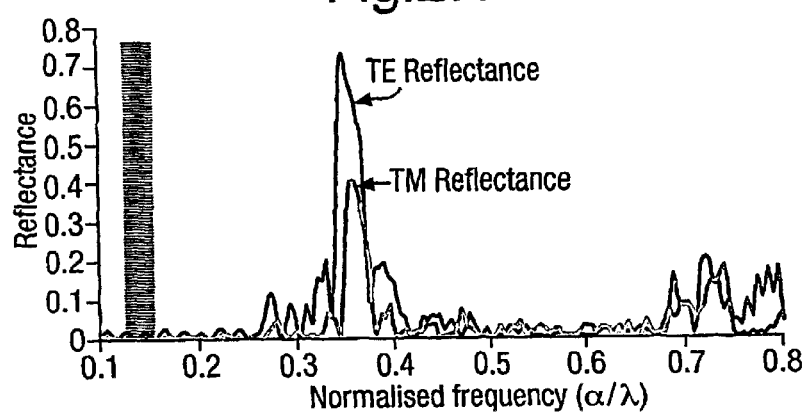
Figure 26:
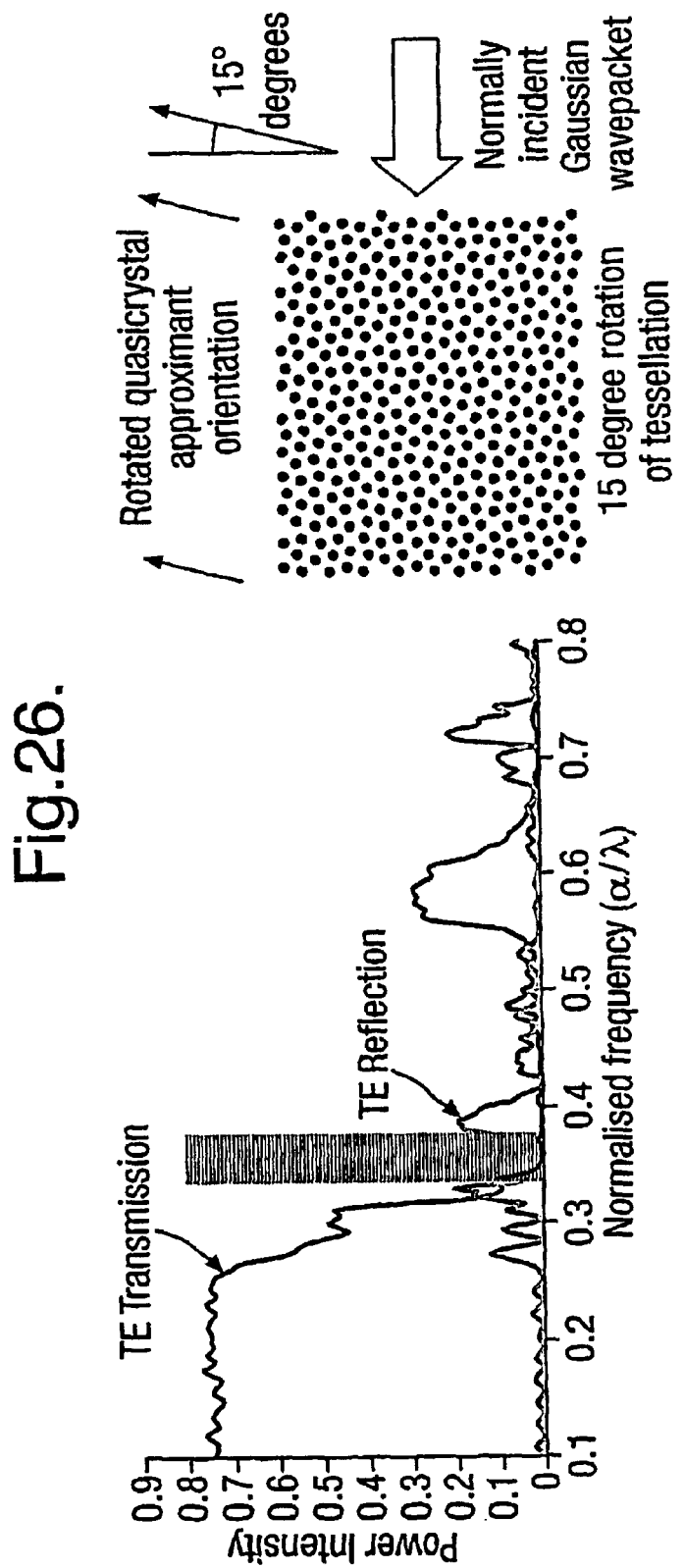

FIGS. 26 and 27 are reflection field plots. Small resonances in the band-gap region are visible due to the coupling of evanescent fields localised at the surface of the PQC and the FDTD output ports, this problem was alleviated by the examination of the far-field transmission and clearly demonstrated the lack of any resonant features in the forbidden region, as shown in FIG. 26. It is also noted that the PBG is always centred at identical midgap frequencies (0.351 a/$\lambda$), confirming the isotropy of the PBG band edges, and the gap-midgap normalised frequency is reduced slightly to $\Delta\omega/\omega_o \approx 14.0\%$. During the analysis of angular dependence of the structure, the PQC only needs to be rotated a maximum of 30 degrees for complete characterisation. This is due to the high symmetry nature of the quasicrystal and hence the repetitive nature of the structure and its pseudo-JZ every 30 degrees (representing 12-fold symmetry). However, it is also adequate to exploit the mirror symmetry properties of the quasicrystal along the high-symmetry planes of the irreducible pseudo-JZ where maximum Bragg reflections are achieved, translating into investigations along the $\Gamma$J and $\Gamma$X (15 degrees from normal incidence) directions only, as shown in FIG. 27. Additionally it is noted that the absolute transmitted power along the $\Gamma$X direction does not amount to unity, this is not surprising when considering that along this propagation direction, absorbing boundary conditions were applied contrary to the periodic boundary conditions applied along the $\Gamma$J direction. The implementation of the PML affects the ability of the output-sampling plane in the FDTD formulation to collect all the incident power contained in the initial Gaussian wavepacket due to scattered light being absorbed by the boundaries before being collected efficiently at the output port. Increasing the absolute width of the PQC structure in the FD space would minimise such problems.

FIG. 27 compares the TM reflectance properties for TE and TM polarisation states along the $\Gamma$X direction. The overlap in the TE and TM polarisation reflectivity indicate the overlap of the complete PBG region. In this case the high reflectivity was selected to highlight the bandgap region in the aim of minimising any confusion surrounding the absolute width of the PBG.

Figure 28:
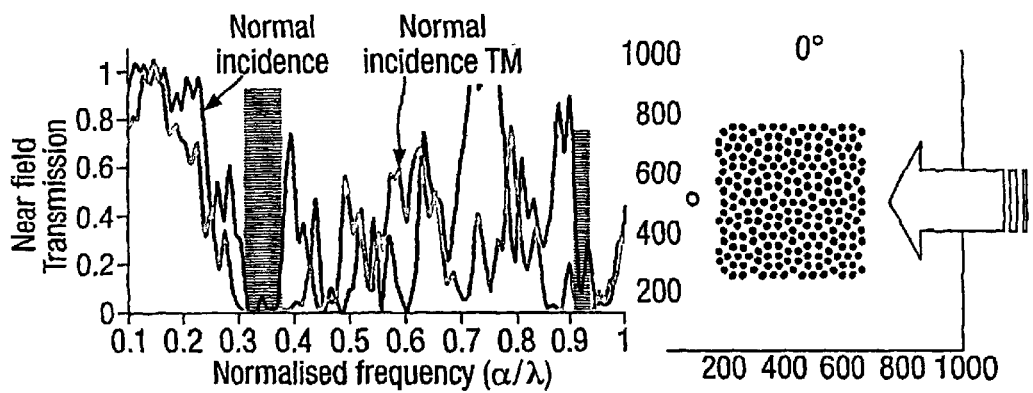
Figure 29:
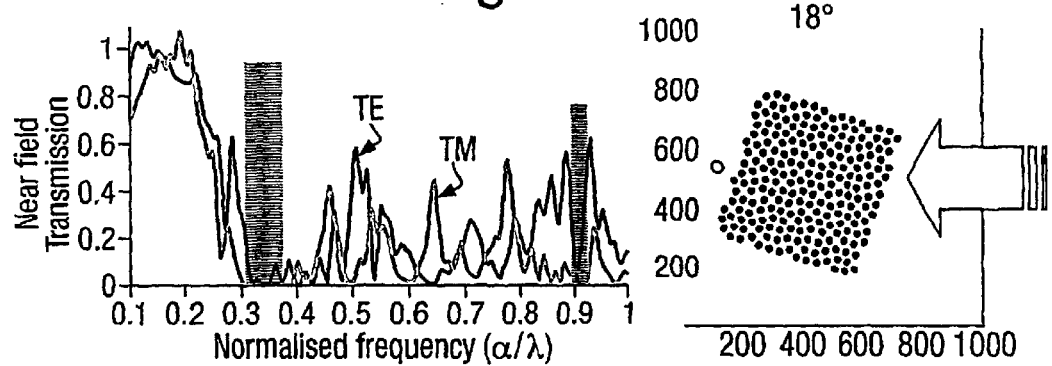
Figure 30:
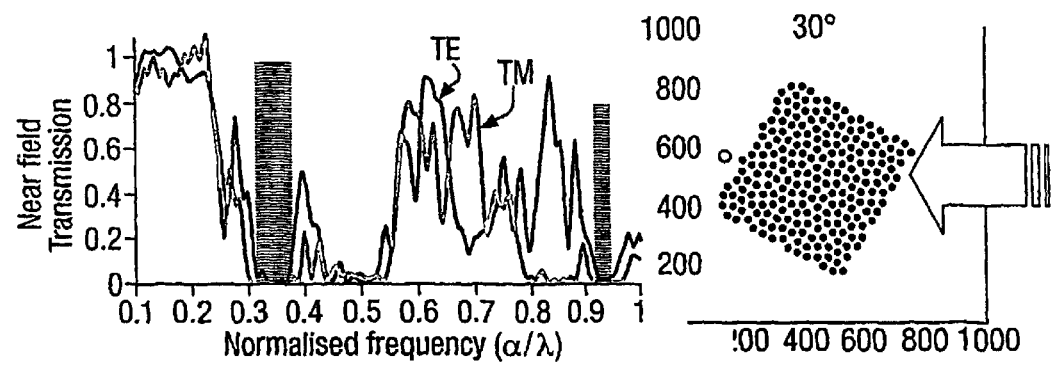

FIG. 28 to FIG. 30 (transmission plots) show the TM polarisation simulations of identical rotations of the quasicrystal approximant, showing primary and secondary complete and absolute PBG for both polarisations and for all directions of light propagation (CAPBG).

Transmission measurements were carried out by spectrally resolving the light propagating through the lattice in different directions. The spectra shown in FIG. 31 show experimental evidence for a complete photonic band gap in a quasicrystal for both TE and TM polarisations. The experiments used a white light continuum produced by focussing 1 $\mu$j 100 fs pulses from a regenerative amplifier tuned to 850 nm in 1 mm of sapphire. The availability of such high-brightness ultra-broadband laser sources facilitates high-accuracy transmittance measurements from 450 nm to 1100 nm through the waveguide. The use of achromatic optics and a carefully designed optical fiber spatial filter provided excellent collimation and pointing properties for coupling into the planar waveguide. Due to the scattering losses caused by the air holes, the spectra in FIG. 31 have been normalised to approximately account for the decreased throughput at shorter wavelengths.

Figure 31A:
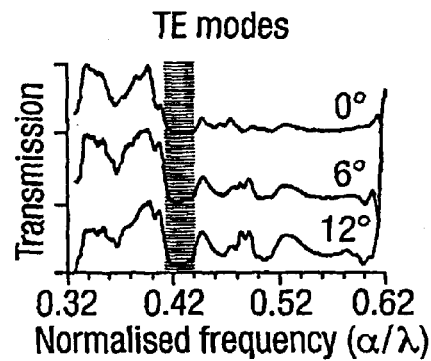
Figure 31B:
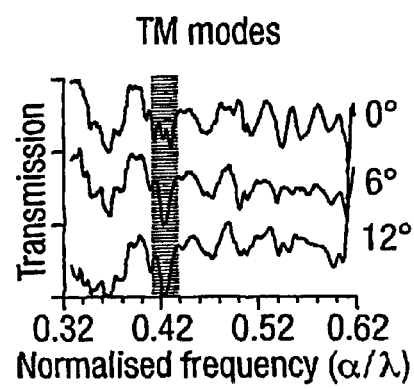
Figure 31C:
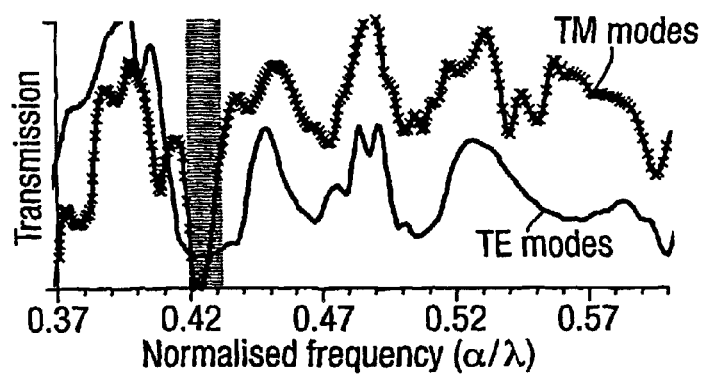

FIGS. 31(a) and (b) demonstrates the highly isotropic first photonic band gap for different angles of incident TE and TM modes respectively. Three different incident light angles are considered for each polarisation 0°, 6° and 12° degrees. The angle of light coupled into the photonic quasicrystal structure is measured with respect to the normal along the quasicrystal surface. FIG. 31(c) shows the experimental transmission plot for the same photonic quasicrystal with incident light along the ΓJ direction. Three sharp bandgaps are clearly visible similar to predicted simulations. Additionally, it is noted that the transmission plots have a strongly modulated structure, these are dramatically different to those associated with periodic photonic crystals. This comes about due to the short-range disorder creating irregularities in the fine structure of the transmission plots. Furthermore, both TE and TM polarisations have gaps residing at the same central points, $0.39\alpha/\lambda$), $0.45\alpha/\lambda$ and $0.52\alpha/\lambda$ giving rise to larger complete and absolute photonic band gaps. The extinction ratio is greater than 95% for all the frequencies in the bandgaps, with a normalised width $\Delta\omega/\omega_0$ ranging from 10%–15%.

The spectra show the same fine structure as that shown in FIG. 29 and in particular the predicted angular and polarisation dependence. However, there are some discrepancies in the absolute position of the gaps. The photonic band gap positions have been shifted by a factor of 1.45 and their widths reduced by a factor of 2 compared to theory. The FDTD calculations were performed using a two-dimensional (2D) model that neglects the real three-dimensional (3D) character of waveguiding in a planar structure. The in-plane 2D component of the wave vector $k_{//}$ is related to the three-dimensional propagation wavevector k in the waveguide by a nonlinear relation, which results in a frequency shift of all the gaps. This is in agreement with three-dimensional modelling using the plane wave method for regular periodic photonic crystals which shows similar behaviour.

Figure 32A:
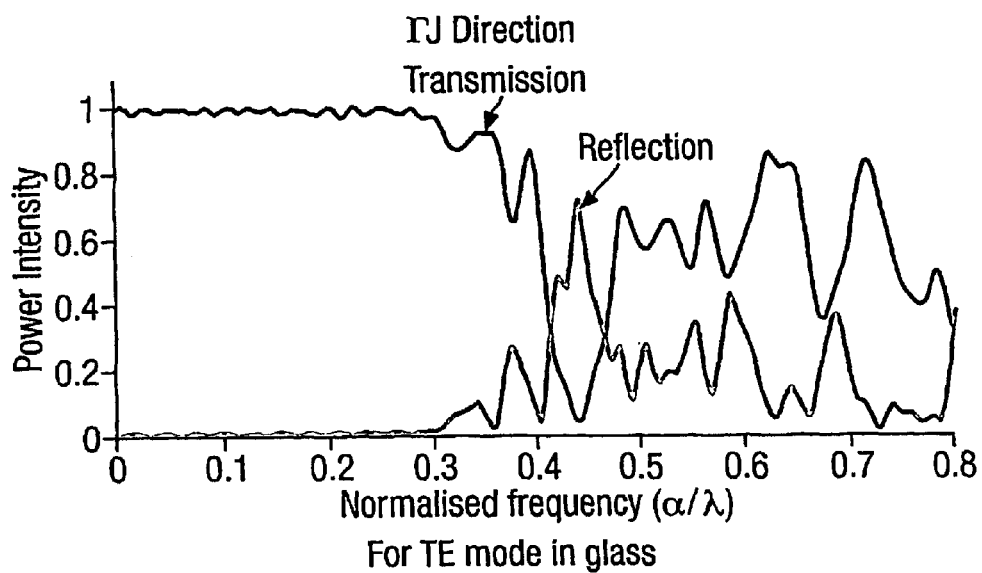
Figure 32B:
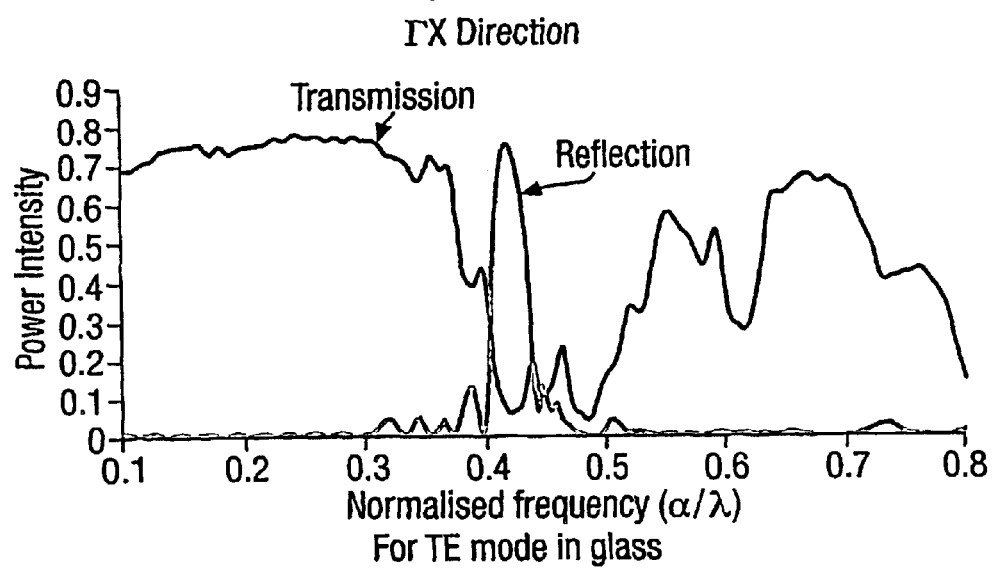
Figure 32C:
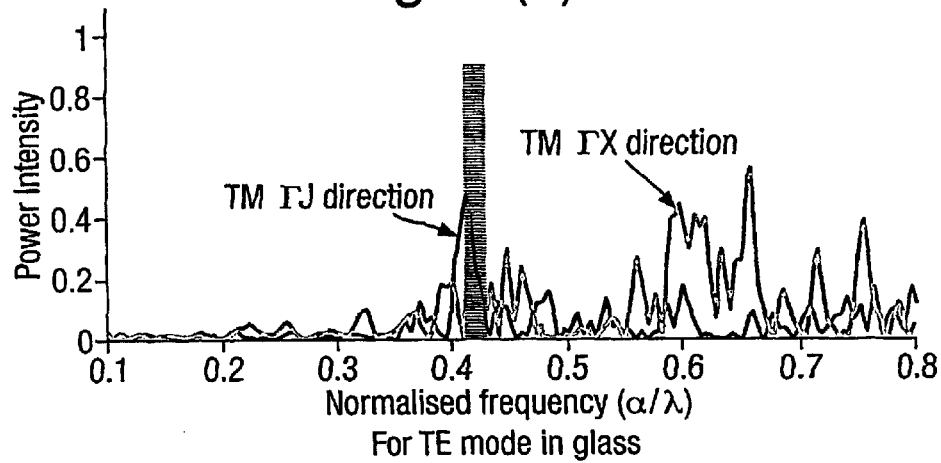

Regarding the behaviour of the PBG with respect to the dielectric constant of the background medium, it was realised that the photonic bandgap remains open even for very low refractive indexes such as glass (n=1.45) with an air filling fraction of f=30.0%. FIG. 32(a), (b) and (c) demonstrates the existence of a complete PBG for TE modes with the PBG ranging from 0.409 a/λ to 0.443 a/λ giving rise to a gap-midgap ratio of $\Delta\omega/\omega_o$=7.9%. Regions of high reflectance indicate the existence of bandgap behaviour while power that is unaccounted for by pure transmittance and reflectance can be accounted for by diffraction effects. For TM polarisation in glass, in this case the reflectivity for both directions ΓJ and ΓX is analysed as shown in FIG. 32. The reflectivity is selected once again to facilitate the identification of the location of the bandgap region. The complete PBG for the TM mode extends from 0.416 a/λ, to 0.431 a/λ giving rise to a minimal but complete gap-midgap ratio of $\Delta\omega/\omega_o$=3.1%. Even though the complete TM bandgap extends over a small region it is situated in the middle of the TE bandgap providing a very valuable CAPBG.

Figure 32D:
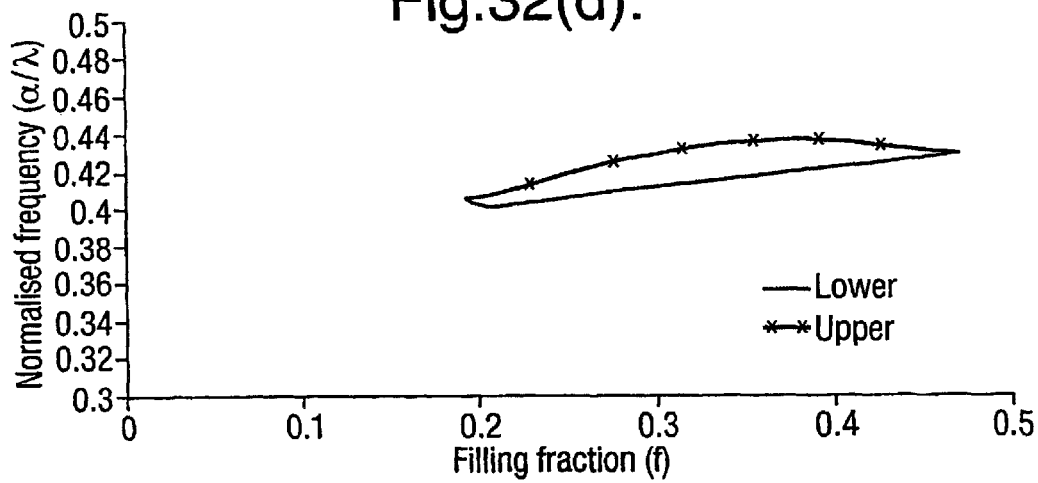

FIG. 32(d) shows the complete band gap in glass material (n=1.45) for a 12 fold symmetric quasicrystal, as a function of filling fractions.

The transmission confirms that it should be possible in practice to integrate photonic quasicrystal devices with optical fibre systems with greatly improved coupling. This is the foundation stone for a range of novel active and passive optical devices. Due to the existence of the CAPBG in such a low refractive index, sharp waveguide bends and splitters can be designed with maximum coupling efficiency and insensitivity to polarisation. This provides the solution to truly large-scale integrated optical devices, where the core layer could be composed of Silicon Dioxide or Quartz.

Out-of-plane diffraction losses are currently one of the major hindering elements in the advancement PC devices. In the design of waveguiding PCs, the incorporation of a low refractive index core layer allows the PQC to behave much like an in-plane structure where small mode angles are involved. The minimisation of the out-of-plane wave vector component would be beneficial in the elimination of radiation losses. However, the effects of weaker confinement in the core layer provide mode profiles that extend farther into the buffer and capping layer. Such a weak core confinement may have an adverse effect on the PBG behaviour and may lead to more lossy devices. To successfully analyse such effects true 3D simulations of the PQC embedded in the glass waveguide are required.

In many transmission spectra (such as FIG. 20), strongly modulated spectral features are present at wavelengths far from the photonic band gaps, this is in great contrast to regular PCs which exhibit smooth spectral structure in these wavelength regions. this spectral detail is associated with short-range disorder which causes strong localisation of photons in particular regions of the quasicrystal.

Figure 33:
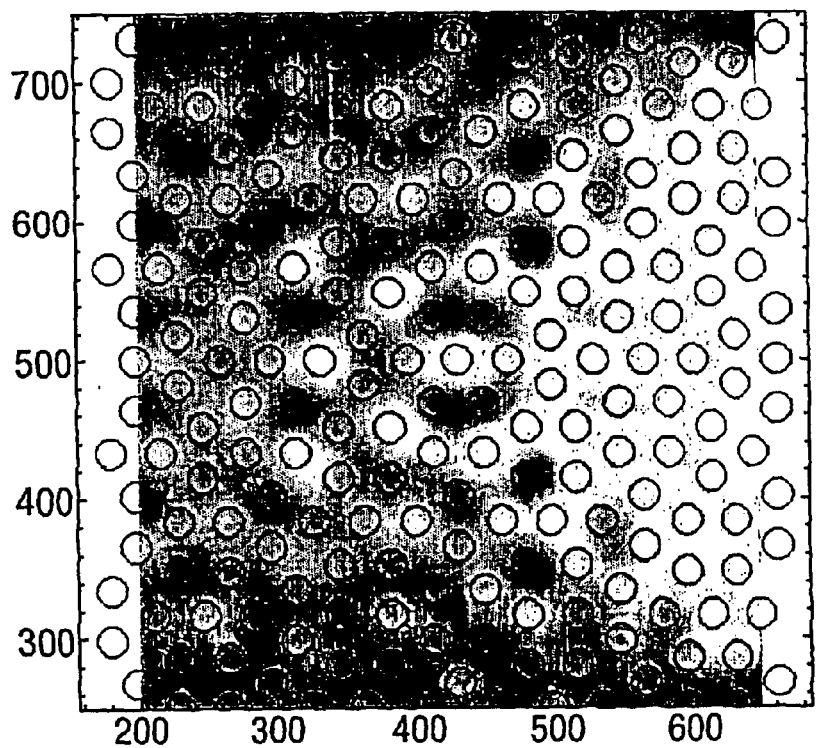
FIGS. 33, 35 and 36 are a scanning electron micrograph and photographs relating to the quasicrystal structure.

Time averaged PDTD methods were used to investigate the localisation of TE and TM polarised modes inside the photonic quasicrystal. FIG. 33 illustrates the confinement of a TE mode in the photonic quasicrystal. The TE mode is incident from the right-hand side of the structure at a wavelength of λ=1100 nm. This λ resides in the bandgap of the structure. In this case localisation of light is seen to be predominantly in the high dielectric regions.

This shows that a bulk PQC can provide a good environment for the provision of high-Q micro-cavity modes or photon localisation. Such localised states play an important role in the design of efficient low-threshold active devices.

The currently accepted method of causing photon localisation in photonic crystals involves the introduction of defects in regular PC structures. Properties of the associated defect states are very sensitive to fabrication tolerances and hence are very difficult to fabricate reliably and with a high yield.

PQCs (photonic quasicrystals) provide a bulk structure, which naturally exhibits such states, and which has the advantage of being easily fabricateD with very good reproducibility.

In addition, high coupling efficiency to defect states in PQC, is clearly observed even for relatively long structures with 30 rows or more. This can be directly compared to single defects in periodic PCs which suffer from weak coupling efficiencies.

Figure 34:
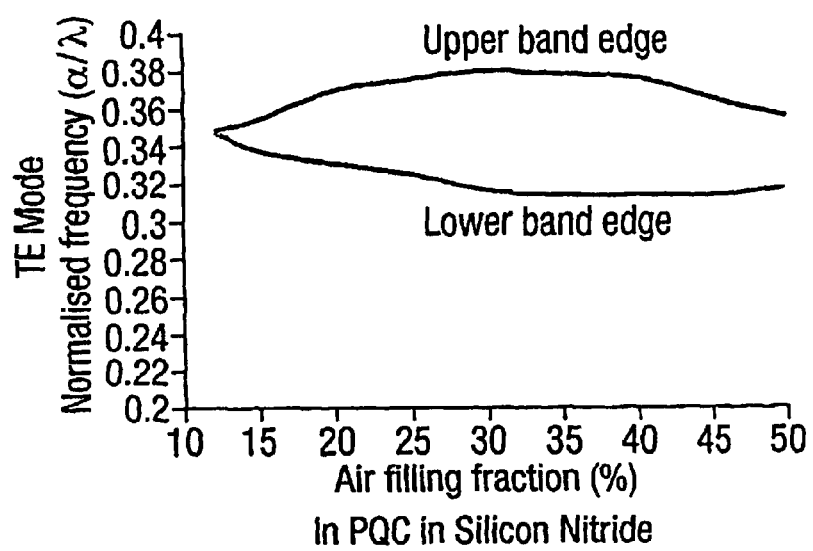
Figure 35A:
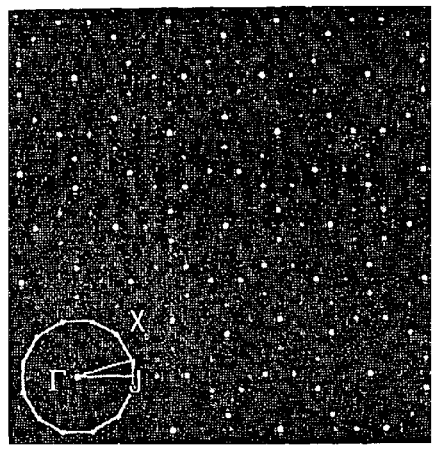
Figure 35B:
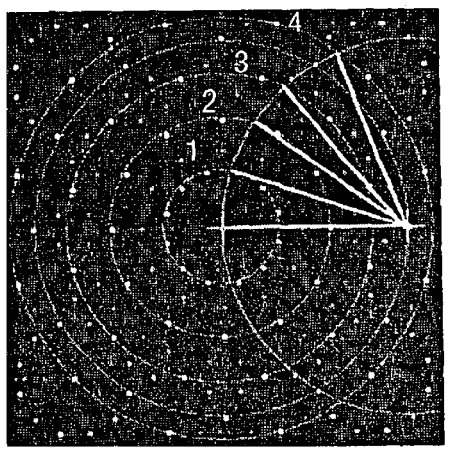

The number of rows of holes plays an important role in the design of PQCs since this directly affects the extinciont ratio at wavelengths inside the band gap. Influence of this design factor is shown in FIG. 34. Strong PBG action is apparent for a PQC thicknesses of 17 rows or more. Structures possessing less than 17 rows of holes show weaker band gaps, but still provide an environment for weak photon localisation The diffractive properties of the quasicrystal were examined by the investigation of the quasicrystal in reciprocal lattice space (FIG. 35). The large parent cell generates the dodecahedral Brillouin zone, accompanied by the irreducible triangular Brillouin zone indicated by the solid white lines. The real lattice vector a extends out to the edges of FIG. 35(a), defining the basic reciprocal lattice vector $2\pi/a$. The twelve central bright Bragg spots in FIG. 35(b) confirm the twelve-fold symmetry of the photonic quasicrystal. FIG. 35(b) illustrates the Ewald sphere construction. The central Bragg peak is selected as the reference point for the construction scheme. The dashed-dotted circles are construction lines. These indicate the equi-distant paths joining any bright Bragg peak and the central reference point. Construction lines for the weaker Bragg peaks are not shown for improved clarity. The lines represent the reciprocal lattice vector kG. The solid grey arc represents the Ewald sphere segment for the wavelength $\lambda=633$ nm, with the reciprocal vector $k_{in}= 2\pi n_{eff}/\lambda$. It is noted that an effective refractive index $n_{eff}=1.98$ is used rather than the absolute refractive index n of the silicon nitride material for better matching with experimental results. Identical $n_{eff}$ are assumed for all k vectors. This approximation can be justified due to the highly isotropic Brillouin zone. The intersection of the grey circle with the construction lines determines the projection angle of the far-field diffraction pattern at 633 nm, $k_{diff}=k_{in}+k_G$. These are indicated by the solid white lines. In theory, this quasicrystal would be expected to diffract incident light into twelve beams. However, in practice, diffracted light from weak intensity Bragg peaks are not visible.

Figure 36A:
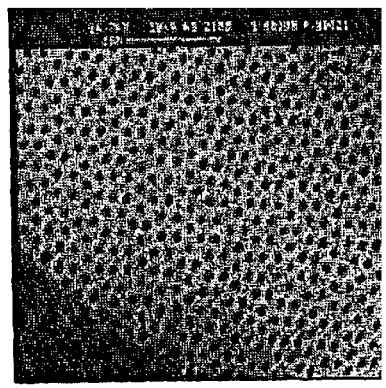
Figure 36B:
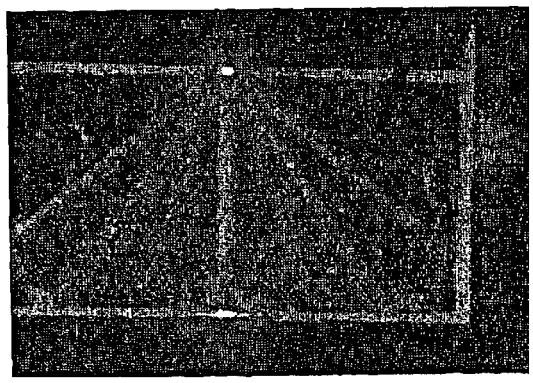

The photonic quasicrystal waveguides were fabricated for a range of parameters, and demonstrated good reproducibility and stability. FIG. 36(a) shows a scanning electron microscope photograph of a typical device from which the pitch of 300 nm and fill fraction of 28% are measured. FIG. 36(b) shows a photograph of the small photonic quasicrystal in operation. The photonic band gap resides horizontally along the top of the photograph. The lower horizontal edge corresponds to a cleaved waveguide face. TE polarised light at 633 nm is focused onto the cleaved waveguide from the bottom of the photograph and is then incident perpendicular to the photonic band gap structure. This demonstrates the experimental far field diffraction of the quasicrystal.

The angles of the diffracted beams have been compared directly with the ones predicted by the Ewald sphere construction shown in FIG. 36(b).

TABLE 1

| Experimental Beam | Angle FIG. A7 | Theoretical Beam | Angle FIG. A2a |
|---|---|---|---|
| A, A' | 20.9, 18.8 | 1 | 18.0 |
| B, B' | 36.3, 33.0 | 2 | 34.6 |
| C, C' | 51.3, 50.1 | 3 | 51.3 |
| D | 66.3 | 4 | 67.9 |

Table 1 lists experimental and theoretical angles of diffraction by photonic quasicrystal for 633 nm radiation.

Table 1 shows good agreement between theoretical and experimental angles of diffraction. This agreement demonstrates the twelve-fold symmetry of the photonic quasicrystal and confirms its successful fabrication and diffractive properties.

Second Embodiments of the Invention

Referring to FIG. 37, this shows in diagrammatic form a device having a regular, triangular, photonic crystal lattice which exhibits a photonic band gap over a predetermined wavelength range.

This lattice is subdivided into two regions, 1 and 2. These two regions each have a sub-lattice comprising a set of defect sites, which consist of a set of pores (12,22) at every fourth site with a slightly smaller diameter than in the bulk of the lattice (as an alternative pores could be larger). They have the effect of introducing a narrow defect mode within the wavelength range of the photonic band gap. The wavelength of this defect mode is strongly dependent upon defect size.

Defects 12 in the first region are of different size (larger) from those 22 of the second region, although, within each region, the defects are of uniform size. Each defect creates a micro-cavity which may support a localised mode at a wavelength lying within the photonic band-gap. Although the defect mode is localised to the position of the defect, it has an evanescent field function (FIG. 38) associated with it which may penetrate a number of rows into the surrounding lattice (analogous to quantum tunnelling). If a number of identical defect sites are introduced into an otherwise regular lattice so that the evanescent fields associated with the confined modes overlap, then the micro-cavities become optically coupled, and it becomes possible for photons to be transferred from one defect site to the next across the bulk of the lattice. Transmission then becomes possible across the photonic crystal at a wavelength lying within the photonic band gap. The wavelength of this defect mode is very strongly related to the size of the defects. On the other hand, if there is no overlap between the evanescent fields associated with neighbouring defect sites, there will be no transmissive defect mode within the photonic band gap wavelength range.

Defects may be arranged on a regular pattern within the photonic band gap lattice or on a random or pseudo-random scheme. The efficiency (and speed) of transmission will be dependent upon the efficiency of coupling between micro-cavities.

The two sets of defects effectively introduce a transmissive defect mode within the energy range of the photonic band gap. However, since the defect wavelength is different on the two sides of the junction, the energy level of the defect mode is lower on the right-hand side 2, for example. (FIG. 39)

Figure 39A:
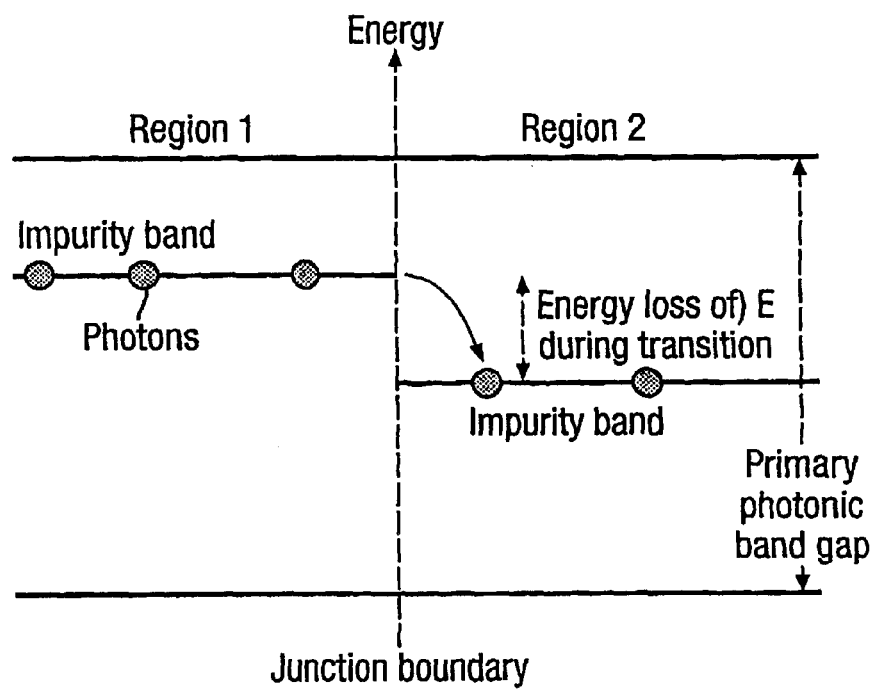
Figure 39B:
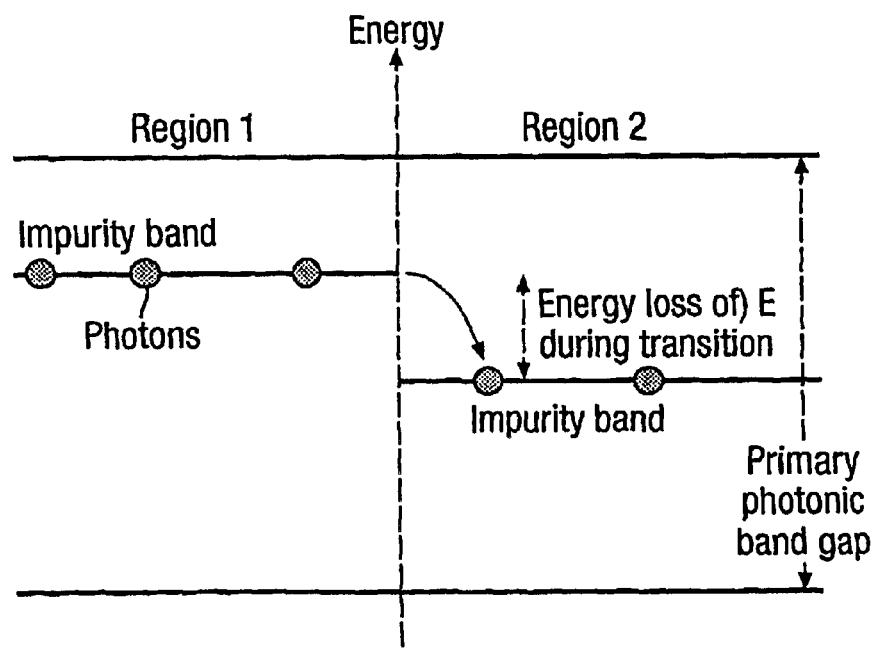

In order that photons may propagate through the structure from left to right, they must lose a small amount of energy (FIG. 39). This translates to a change in wavelength or colour. Similarly, photons cannot propagate in the opposite direction since this would involve a small increase in energy (FIG. 39).

Hitherto it had been thought has been that photons do not spontaneously change their wavelength in passive materials and hence the loss mechanism was missing. We have found, however, that materials with the lattice structure of the present invention, such as the silicon nitride structure described above (or a silicon oxynitride structure), exhibit non-linear (power dependent) wavelength shifting effects. This power dependent wavelength shifting effect facilitates the operation of a diode-junction device described above. Thus, by sending in a high power signal into the left-hand region (1) of the device the wavelength of the defect mode may be reduced (in region 1) due to the non-linearity of the structure, allowing the high power signal to traverse the junction and propagate across the right-hand region (2) of the device.

If sent in the opposite direction, however, (from region 2 to 1), the material non-linearity would cause a further reduction in wavelength of the defect mode, and there would be no suitable defect mode tuned to that wavelength in region (1) so transmission would not be possible.

The optical power threshold level required to create the non-linearity is analogous to the electrical bias voltage which must be applied across a semi-conductor pn junction to obtain conductance.

An alternative method of operation is based on a photonic crystal with two distinct regions. (FIG. 40) Each region consists of a regular triangular lattice photonic crystal with no defects. Each region however is designed to have a slightly different photonic band gap wavelength range. (This may be achieved by varying the lattice pitch and/or the pore diameter).

By applying a high power optical pulse to one side of the junction, the edges of the band gap become shifted. A situation can occur where the band edges become shifted so that they coincide in wavelength with the band edge of the opposite region of the device. At this point transmission becomes possible giving rise to diode action.

By using a high power second laser beam to apply the optical bias to the device, an optical switch could be created where the small amount of extra power supplied by the signal beam causes the band gap edges to coincide. It is not essential for the band gaps to coincide. What is important is that the signal wavelength should be positioned within one photonic gap but not the other, before extra power is applied, and when the extra power is applied, the signal wavelength should be clear of both photonic band gaps.

Figure 40:
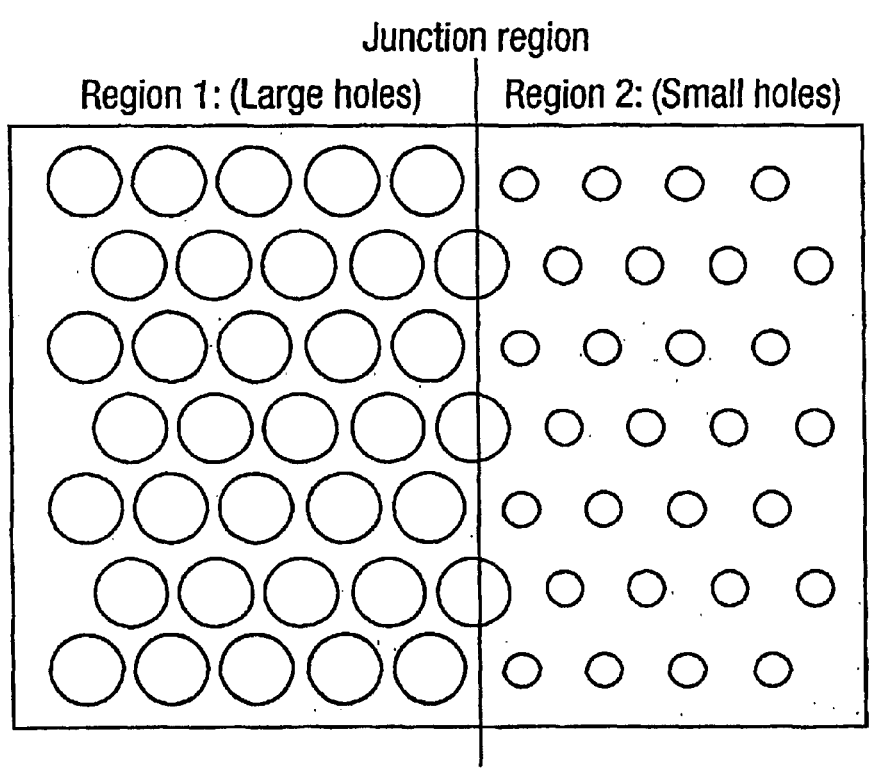
Figure 41:
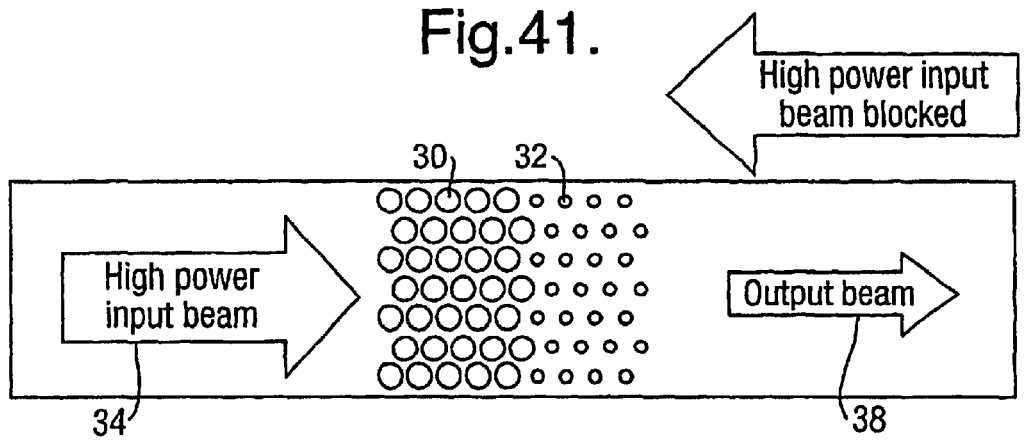

Referring to FIGS. 41 to 45, various further embodiments of the invention are shown. FIG. 41 is a diode structure based on the crystal lattice structure shown in FIG. 40 in which a high power input beam approaching from the left-hand side provides at output beam, whereas a high power input beam from the right-hand side is blocked. This is because the two regions of crystal lattice structure 30, 32 provide two photonic band gaps with an upper edge of slightly different values. When a high power input beam is input from the left, the non linearity of the lattice structure 30 causes the band gap upper edge to be shifted downwardly in energy so that the wavelength of the input beam is above the upper edge. Light is therefore transmitted above both upper edges to provide an output beam. However light approaching from the right will influence the lattice structure 32 to lower the upper edge of the photonic band gap, but the photonic band gap in region 30 will remain unchanged. Thus light will be blocked.

Figure 42:
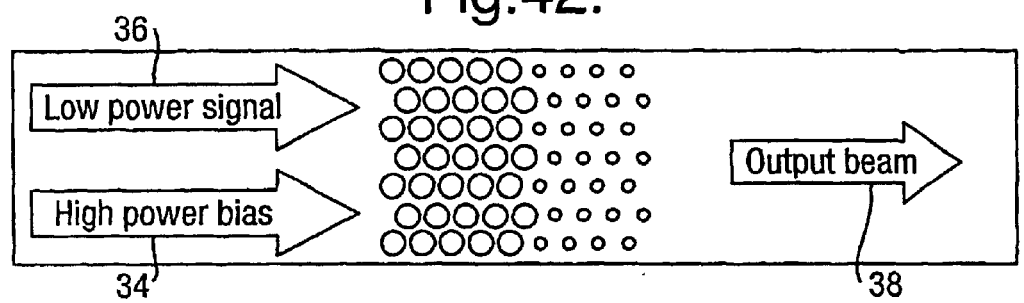
Figure 44:
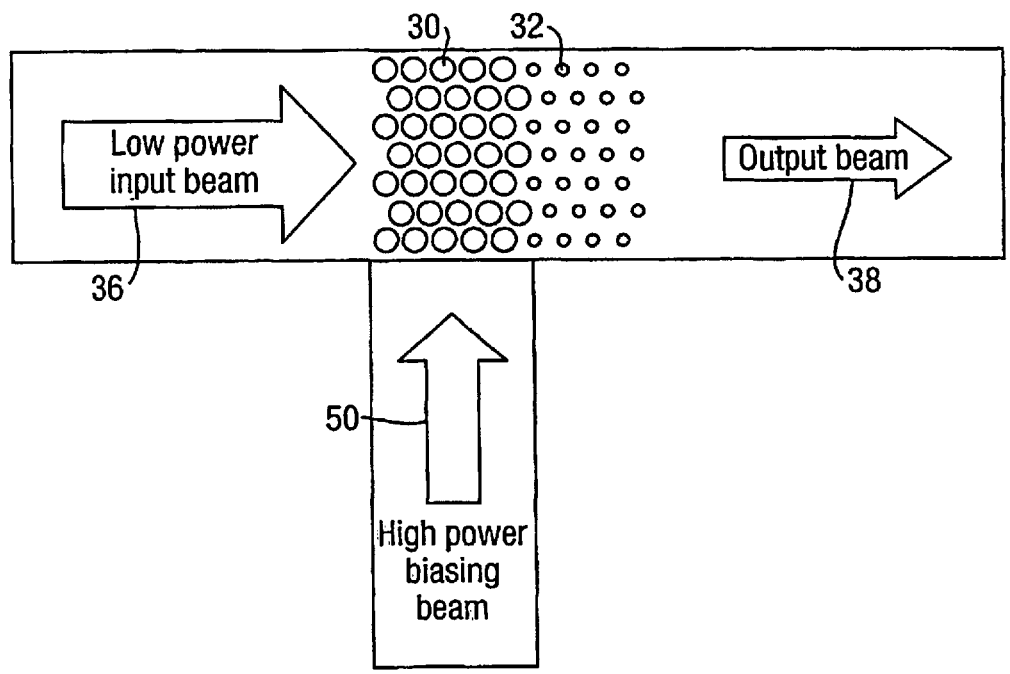

Referring to FIG. 42 this shows a similar structure to that of FIG. 44, but wherein a high power bias optical signal 34 is provided, at any desired wavelength in order to influence the structure 30 to lower the photonic band gap whereby to permit an input low power signal 36 having a signal wavelength to pass through the structure to provide an output beam 38. This structure provides a relay or switch function.

Figure 43:
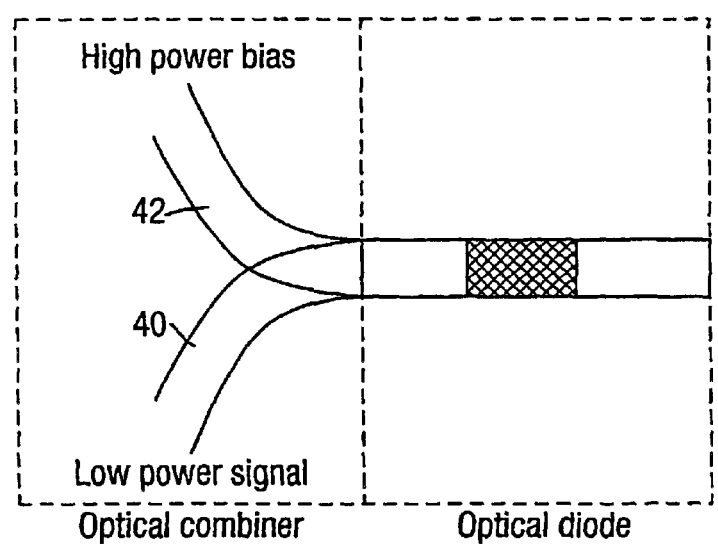

Referring to FIG. 43, this shows a concrete form of the embodiment of FIG. 42 wherein the low power signal 36 and a high power bias signal 34 are conducted to the structure 30, 32 by optical fibre paths 40, 42.

Referring to FIG. 44, this shows a schematic transistor arrangement employing the structure 30, 32 of FIG. 41. A high power biasing beam 50 is applied to region 30 to modulate the photonic band gap of region 30 whereby to permit a fraction of an input light beam 36 to be transmitted as an output beam 38. Thus by careful adjustment of the parameters of power and signal wavelength, the power beam 50 acts to modulate the power to the output beam 38, in a manner similar to a transistor.

Figure 45:
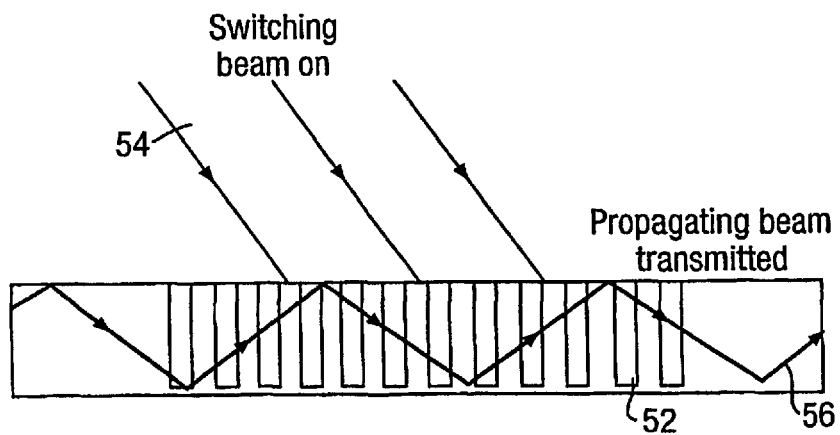

In FIG. 45, a lattice structure is employed 52 comprising a signal region of a regular triangular lattice. A high power light beam 54 applied to the surface of the crystal structure modifies the photonic band gap to permit light to be propagated through the crystal structure as a beam 56.

Figure 46:
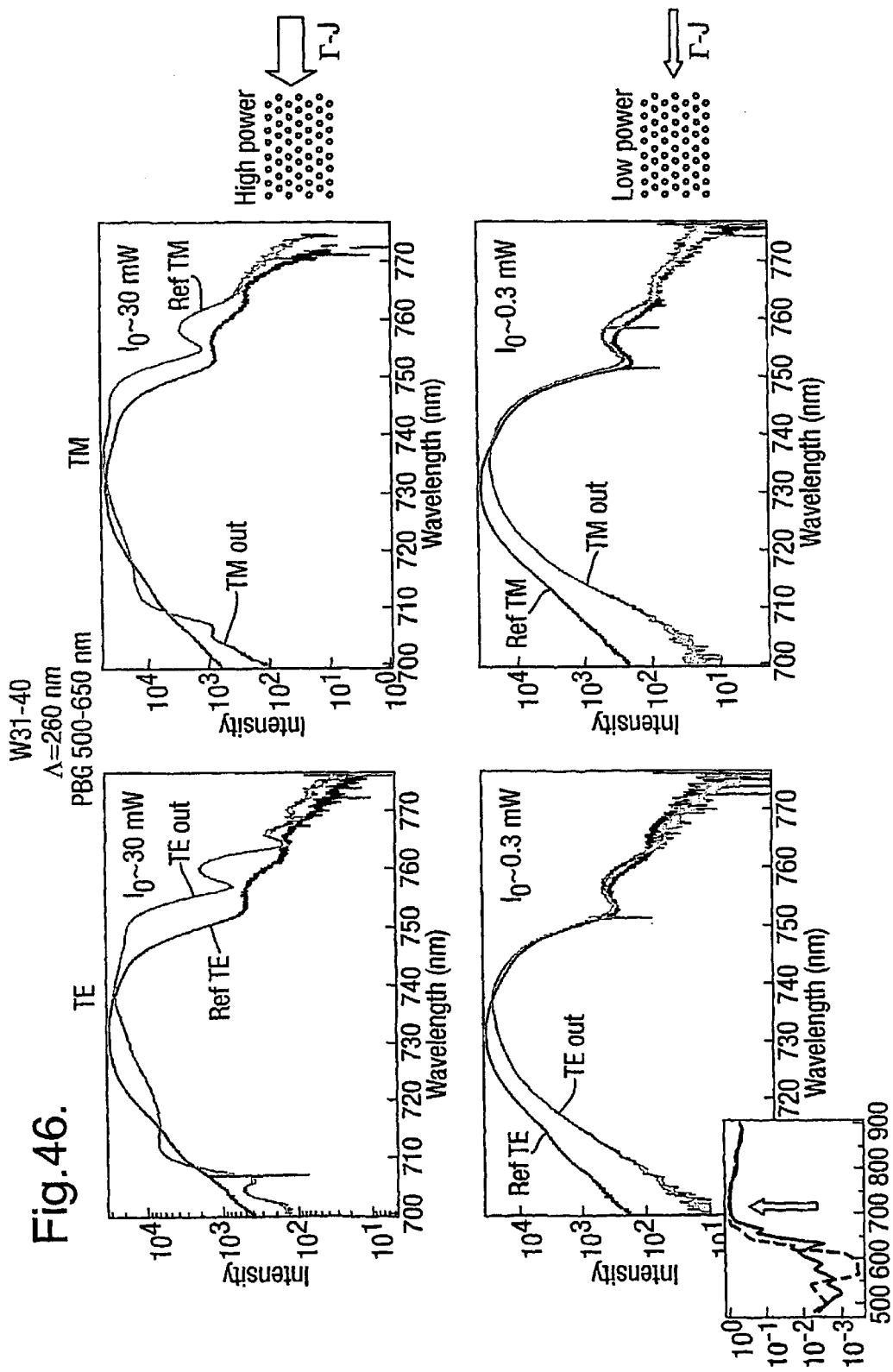
FIGS. 46 and 47 show experimental transmission spectra for triangular lattices howing an aspect of the invention.
Figure 47:
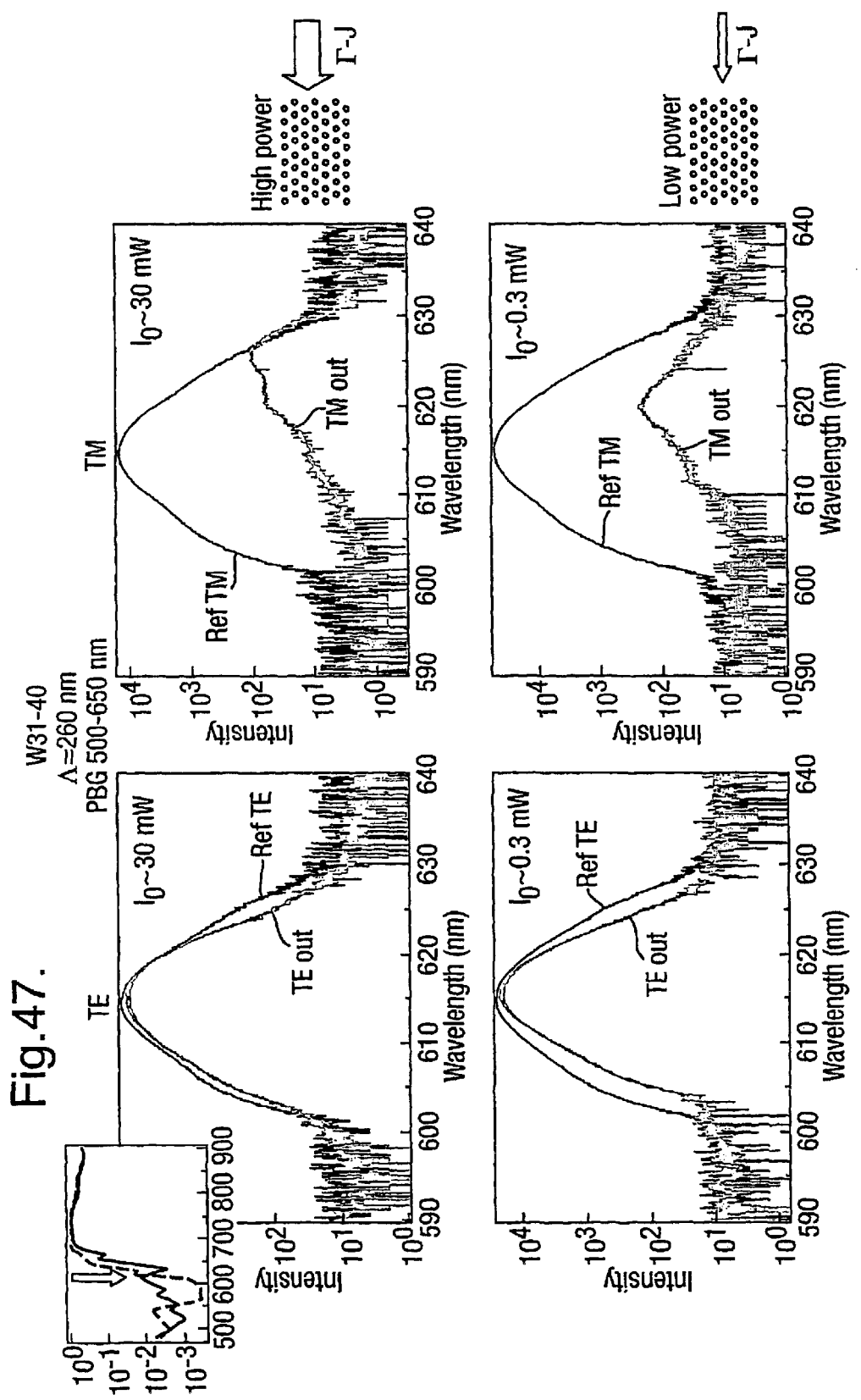

The precise characteristics of a crystal structure with a similar form to region 1 of FIG. 40 had been determined experimentally as shown in FIGS. 46 and 47. FIG. 46 shows propagation of TE and TM modes outside the band gap, ie. with an energy greater than that of the upper level of the band gap, but very close to the upper band edge and FIG. 47 shows propagation of both modes at the energy level of the upper edge of the band gap.

In FIG. 46 the inset at the lower left-hand side shows the signal wavelength in relation to the band gap, the signal wavelength being over 700 nm whereas the band gap is in a region about 600 nm. The main graphs compare spectra for a signal laser beam signal (which has passed through a photonic crystal structure embedded in a silicon nitride waveguide) with a reference laser beam (which has passed through a similar waveguide structure but which did not have a photonic crystal embedded in it), at two different power levels.

It may be seen that for both modes at wavelengths close to the upper band edge, there is little change in spectral properties for the reference laser beam as the power changes from low power (as shown in the lower graphs) to high power (as shown in the upper graphs).

However there is a significant change in spectral shape for light transmitted through the signal beam which has passed through the photonic crystal as the power changes from low power to high power.

In comparison with the reference signal, the spectral shape of the laser beam has been flattened and shifted to slightly longer wavelengths.

This effect is due to an enhanced optical power density due to localisation close to the upper band edge. The increased optical power density has in turn caused the effective refractive index of the silicon nitride material to change slightly due to an induced non-linearity. This in turn has caused the edge of the band gap to shift in position.

Referring now to FIG. 47, the graphs show the power dependent behaviour of a photonic crystal device at shorter wavelengths lying just within the photonic band gap. The signal wavelength in relation to the band gap as shown in the inset at the upper left-hand side is of a value about 610 nm.

It may be seen for the TE mode, the spectra for the beam transmitted through the photonic crystal is roughly the same as the reference spectra for both high and low power, although there is a small shift to longer wavelengths for the signal beam.

For the TM mode, at both low and high power there is a considerable difference between the reference and transmitted signal spectra.

In both cases, the signal transmitted through the photonic crystal has been shifted considerably towards longer wavelengths. At low power (shown in the lower right-hand graph), the transmitted signal has a peak centered at about 620 nm. For a high power input signal the transmitted signal has a wavelength spectra centered about 627 nm. thus a power dependent wavelength change has been induced upon the signal by the influence of the photonic band gap.

This is caused by a shifting in the photonic band gap edge for high powers, going to a slightly higher wavelength (lower energy). This edge shifting is caused by the non-linearity of the lattice structure. It should be noted that silicon nitride which the material is formed is not in itself a non-linear material but that the triangular lattice structure induces a strong linear non-linearity effect. For the purposes of this specification, non-linearity means that the refractive index of the material is dependent on the applied power of the optical signal.

What is claimed is:

1. A method of forming a structure exhibiting a photonic band gap, the method comprising the steps of:
   providing a material extending in two dimensions, and
   forming in said material, first and second regions, said first region having a first refractive index, the first regions being spaced apart by a second region or regions, said second regions having a second refractive index, said first and second regions defining a quasicrystal, said quasicrystal exhibiting long range order but short term disorder, and exhibiting n-fold symmetry wherein n is greater than or equal to two,
   whereby said quasicrystal provides a photonic band gap extending in at least said two dimensions.

2. A method or structure according to claim 1, wherein the photonic band gap is generally uniform in any direction within said two dimensions, having the same width and/or same mid gap frequency.

3. A method or structure according to claim 2, wherein the photonic band gap is uniform in any direction to within 4%, and preferably within 1%.

4. A method or structure according to claim 1, wherein the photonic band gap is generally the same for all states of polarisation.

5. A method according to claim 4, wherein the air holes are subsequently filled with a desired material.

6. A method according to claim 5, wherein the desired material is liquid crystal, ferromagnetic, a dye, or an optical non-linear material, whose optical properties may be influenced by application of an electric, magnetic, electromagnetic field, or optical field, temperature, acoustic radiation, or chemical reagent.

7. A structure or method according to claim 1, wherein the quasicrystal exhibits a 12 fold symmetry.

8. A structure or method according to claim 7, wherein the approximant tiling is based on an assembly of adjacent rectangles, triangles or rhombi.

9. A structure or method according to claim 1, wherein the quasicrystal has a unit cell structure.

10. A structure or method according to claim 1, wherein the quasicrystal exhibits 10-fold symmetry, being based on Penrose tiling, or the quasicrystal is based on Archimedian tiling.

11. A structure or method according to claim 1, wherein the material is selected from silicon, germanium, silicon nitride, silicon oxynitride, gallium arsenide or indium phosphide, or compounds or mixtures thereof, or a glass, or a plastic.

12. A structure or method according to claim 11, wherein the material is silicon nitride or silicon oxynitride.

13. A structure or method according to claim 11, wherein the material is a glass, preferably a silica glass.

14. A structure or method according to claim 1, wherein said first regions are positioned at apices of the crystal lattice, or at the centre of shape sites.

15. A structure or method according to claim 1, wherein said first regions define a quasicrystal geometry in two dimensions, and n>6.

16. A structure or method according to claim 1, wherein said material extends in three dimensions, and said first regions extend in a direction perpendicular to said two dimensions.

17. A structure or method according to claim 16, wherein the material comprises an optical fibre, and said first regions extend along the length of the fibre.

18. A structure or method according to claim 1, wherein the first regions are formed as lengths parallel to one another in one of the two dimensions, the spacing of the lengths in the second dimension being such as to provide said photonic band gap in at least said two dimensions, and wherein n is two or more.

19. A structure exhibiting a photonic band gap, said structure comprising a material, extending in two dimensions, said material comprising first and second regions, said first regions having a first refractive index spaced from one another by a second region or regions, said second regions having a second refractive index, said first and second regions defining a quasicrystal, said quasicrystal exhibiting long range order but short term disorder, and exhibiting n-fold symmetry, wherein n is greater than or equal to two, said quasicrystal creating a photonic band gap extending in at least said two dimensions.

20. A method of forming a structure exhibiting a photonic band gap, the method comprising the steps of:
   providing a material, extending in two dimensions, said material having a relatively low index of refraction, less than or equal to three, and
   forming in said material first and second regions, said first regions having a first refractive index, the first regions being spaced apart by a second region or regions, said second regions having a second refractive index, the first and second regions defining a quasicrystal, said quasicrystal exhibiting long range order but short term disorder and exhibiting an n-fold symmetry where n is greater than or equal to two, whereby said quasicrystal provides a photonic band gap extending in at least said two dimensions.

21. A method of forming a structure exhibiting a photonic band gap, the method comprising:
   providing a material extending in two dimensions and forming in said material first regions, having a first refractive index, the first regions being spaced apart by a second region or regions of a second refractive index, the regions defining a quasicrystal exhibiting long range order but short term disorder and exhibiting n-fold symmetry, wherein n≧12, whereby to create a photonic band gap extending in at least said two dimensions.

22. A method of forming a structure exhibiting a photonic band gap, the method comprising:
   providing a material, extending in two dimensions, and etching the material to remove material in predetermined areas, the etching extending in a direction perpendicular to said two dimensions, whereby to define first regions having a first refractive index spaced by a second region or regions having a second refractive index, whereby to define a quasicrystal exhibiting long range order but short term disorder and exhibiting n-fold symmetry wherein n is greater than or equal to two, whereby to create a photonic band gap extending in at least said two dimensions, and
   wherein the ratio of the area of the first regions to the area of the second regions is relatively low, being less than 35%.

23. A method according to claim 22, wherein the ratio is 28%, or less.

24. A method according to claim 22, wherein said predetermined areas comprise said first regions.

25. A method according to claim 24, wherein said first regions comprise air holes.

26. A structure exhibiting a photonic band gap, wherein the structure includes a material comprising first and second regions, said first regions having a first refractive index and spaced from one another by at least a second region, said second region having a second refractive index, said first and second regions providing a quasicrystal exhibiting a photonic band gap, such as to modify the properties of the material to induce a significant non-linear effect wherein the refractive index of the structure is dependent upon the power of light incident on the structure.

27. An optical switch incorporating a structure according to claim 26, including means for directing a power beam of light onto the structure, and including means for directing a signal beam of light through the structure and whereby the power beam changes the refractive index of material and creates a path for the signal beam of light.

28. An optical device comprising a body having at least one path there through for the transmission of optical radiation wherein the transmission characteristics of said radiation when traversing said path are constrained by a first and second regions disposed within said body, said first and second regions comprised of at least one material exhibiting a photonic band gap wherein said first and second regions are positioned relative to one another so that an evanescent field associated with the photonic band gap of said first region interacts with an evanescent field associated with the photonic band gap of said second region to cause said transmission characteristic to be essentially non-linear, asymmetric or controllable.

29. An optical diode incorporating a device according to claim 28, including means for directing a signal beam of light through a transmission path.

30. An optical switch or transistor incorporating a device according to claim 28, including means for directing a signal beam of light through the transmission path, and means for directing a modulating beam of light onto the first and/or second area to alter the refractive index thereof, thereby to alter the transmission properties of the transmission path.

31. An optical device having an optical transmission path through first and second adjacent areas, each area comprised of first and second regions, said first region comprising a plurality of first regions, each of said first region having a first refractive index, said first regions spaced apart by at least one second region, said second region having a second refractive index, said first and second regions defining a quasicrystal structure having a photonic band gap, and each such quasicrystal structures having defects therein to create photonic states within the band gap and associated evanescent fields, the evanescent fields of the first and second areas being coupled so as to permit transmission within the photonic band gap, the transmission characteristic being non-linear or asymmetric.

32. A device according to claim 31, wherein for each area, the defect structure is formed by predetermined first regions being of a different size or shape to the remainder of the first regions, or being of a different material, or by omitting predetermined first regions, to create a set of defects coupled to one another by evanescent fields.

33. A device according to claim 32, wherein the defect structure comprises a periodic array of defects.

34. A device according to claim 32, wherein the defects in the first area are different, and/or have a different spacing, from defects in the second area.

35. An optical device having an optical transmission path through first and second adjacent areas, each area being formed from a layer of material comprising first and second regions, said first regions having a first refractive index and being spaced apart by at least one second region, having a second refractive index, the first and second regions defining a quasicrystal structure having a photonic band gap, the photonic band gaps in the two areas having different values, whereby light incident on the one area adjusts the band gap value relative to the band gap of the other area.

36. A optical device according to claim 35, wherein at least one of the first and second areas exhibiting a non-linear refractive index.

37. An optical device according to claim 35, wherein the band gaps are adjustable so as to be equal in value.

38. An optical device according to claim 35, wherein the crystal or quasi crystal structures in the respective first and second areas are different, being of a different symmetry, and/or the respective first regions have a different size and/or spacing.

* * * * *